(12) United States Patent
Yamazaki et al.

(10) Patent No.: US 7,575,985 B2
(45) Date of Patent: *Aug. 18, 2009

(54) METHOD OF FABRICATING SEMICONDUCTOR DEVICE

(75) Inventors: Shunpei Yamazaki, Tokyo (JP); Tamae Takano, Kanagawa (JP); Koji Dairiki, Kanagawa (JP)

(73) Assignee: Semiconductor Energy Laboratory Co., Ltd., Kanagawa-Ken (JP)

( * ) Notice: Subject to any disclaimer, the term of this patent is extended or adjusted under 35 U.S.C. 154(b) by 239 days.

This patent is subject to a terminal disclaimer.

(21) Appl. No.: 11/601,699

(22) Filed: Nov. 20, 2006

(65) Prior Publication Data

US 2007/0148922 A1    Jun. 28, 2007

Related U.S. Application Data

(62) Division of application No. 10/882,634, filed on Jul. 2, 2004, now Pat. No. 7,141,490, which is a division of application No. 10/001,785, filed on Dec. 5, 2001, now Pat. No. 6,759,313.

(30) Foreign Application Priority Data

| Dec. 5, 2000 | (JP) | 2000-370724 |
| Dec. 5, 2000 | (JP) | 2000-370787 |
| Dec. 5, 2000 | (JP) | 2000-370794 |
| Dec. 28, 2000 | (JP) | 2000-403513 |

(51) Int. Cl.
*H01L 21/00* (2006.01)
*H01L 21/84* (2006.01)
*H01L 21/336* (2006.01)
*H01L 21/20* (2006.01)
*H01L 21/36* (2006.01)

(52) U.S. Cl. .......... 438/486; 438/487; 438/166; 438/308

(58) Field of Classification Search .......... 438/486, 438/487, 482, 489, 491, 495, 308
See application file for complete search history.

(56) References Cited

U.S. PATENT DOCUMENTS 5,529,937 A    6/1996    Zhang et al.

(Continued)

FOREIGN PATENT DOCUMENTS

EP    0 651 431 A2    5/1995

(Continued)

OTHER PUBLICATIONS

Radnoczi, G. et al., "A1 induced crystallization of a-Si.", J. Appl. Phys., vol. 69, May 1, 1991, pp. 6394-6399.

(Continued)

*Primary Examiner*—Chuong A. Luu
(74) *Attorney, Agent, or Firm*—Nixon Peabody LLP; Jeffrey L. Costellia

(57) ABSTRACT

In a manufacturing process of a semiconductor device using a substrate having low heat resistance, such as a glass substrate, there is provided a method of efficiently carrying out crystallization of a semiconductor film and gettering treatment of a catalytic element used for the crystallization by a heating treatment in a short time without deforming the substrate. A heating treatment method of the present invention is characterized in that a light source is controlled in a pulsed manner to irradiate a semiconductor film, so that a heating treatment of the semiconductor film is efficiently carried out in a short time, and damage of the substrate due to heat is prevented.

19 Claims, 21 Drawing Sheets

U.S. PATENT DOCUMENTS

| | | | |
|---|---|---|---|
| 5,643,826 A | 7/1997 | Ohtani et al. | |
| 5,654,203 A | 8/1997 | Ohtani et al. | |
| 5,731,637 A | 3/1998 | Hori et al. | |
| 5,773,329 A | 6/1998 | Kuo | |
| 5,821,138 A | 10/1998 | Yamazaki et al. | |
| 5,923,962 A | 7/1999 | Ohtani et al. | |
| 5,946,562 A | 8/1999 | Kuo | |
| 6,121,660 A | 9/2000 | Yamazaki et al. | |
| 6,140,166 A | 10/2000 | Ohtani et al. | |
| 6,140,668 A | 10/2000 | Mei et al. | |
| 6,143,630 A | 11/2000 | Tregilgas | |
| 6,162,667 A | 12/2000 | Funai et al. | |
| 6,201,585 B1 | 3/2001 | Takano et al. | |
| 6,251,712 B1 | 6/2001 | Tanaka et al. | |
| 6,285,042 B1 | 9/2001 | Ohtani et al. | |
| 6,306,694 B1 | 10/2001 | Yamazaki et al. | |
| 6,376,333 B1 | 4/2002 | Yamazaki et al. | |
| 6,420,246 B1 | 7/2002 | Yamazaki et al. | |
| 6,465,288 B1 | 10/2002 | Ohnuma | |
| 6,518,102 B1 | 2/2003 | Tanaka et al. | |
| 6,599,818 B2 | 7/2003 | Dairiki | |
| 6,670,225 B2 | 12/2003 | Ohnuma | |
| 6,680,223 B1 | 1/2004 | Yamazaki et al. | |
| 6,686,262 B2 | 2/2004 | Yamazaki et al. | |
| 6,787,407 B2 | 9/2004 | Nakamura et al. | |
| 6,821,827 B2 | 11/2004 | Nakamura et al. | |
| 6,855,580 B2 | 2/2005 | Tanaka et al. | |
| 6,924,528 B2 | 8/2005 | Yamazaki et al. | |
| 6,949,418 B2 | 9/2005 | Yamazaki et al. | |
| 6,998,282 B1 | 2/2006 | Yamazaki et al. | |
| 7,141,490 B2 * | 11/2006 | Yamazaki et al. | 438/486 |
| 7,186,597 B2 | 3/2007 | Yamazaki et al. | |
| 7,195,990 B2 | 3/2007 | Yamazaki et al. | |
| 7,361,519 B2 | 4/2008 | Yamazaki et al. | |
| 7,369,215 B2 * | 5/2008 | Takami | 355/67 |
| 7,374,978 B2 | 5/2008 | Yamazaki et al. | |
| 7,375,782 B2 | 5/2008 | Yamazaki et al. | |
| 7,384,860 B2 | 6/2008 | Nakamura et al. | |
| 2001/0005019 A1 | 6/2001 | Ishikawa | |
| 2001/0005606 A1 | 6/2001 | Tanaka et al. | |
| 2001/0009283 A1 | 7/2001 | Arao | |
| 2001/0015441 A1 | 8/2001 | Kawasaki et al. | |
| 2004/0007748 A1 | 1/2004 | Sakama et al. | |
| 2004/0077185 A1 | 4/2004 | Dairiki | |
| 2007/0166959 A1 | 7/2007 | Yamazaki et al. | |

FOREIGN PATENT DOCUMENTS

| | | |
|---|---|---|
| JP | 05-109737 | 4/1993 |
| JP | 07-130652 A | 5/1995 |
| JP | 07-183540 A | 7/1995 |
| JP | 08-288522 | 11/1996 |
| JP | 08-330602 | 12/1996 |
| JP | 09-306838 | 11/1997 |
| JP | 10-070077 | 3/1998 |
| JP | 10-229048 | 8/1998 |
| JP | 11-054760 | 2/1999 |
| JP | 11-097706 | 4/1999 |
| JP | 2002-176001 | 6/2002 |
| JP | 2002-190452 | 7/2002 |
| JP | 2002-203787 | 7/2002 |
| JP | 2002-231627 | 8/2002 |
| WO | WO-0148797 | 7/2001 |

OTHER PUBLICATIONS

Tsutsui et al., "Electroluminescence in Organic Thin Films", Photochemical Processes in Organized Molecular Systems, 1991, pp. 437-450.

M. A. Baldo et al., "Highly Efficient Phosphorescent Emission from Organic Electroluminescent Devices", Nature vol. 395, Sep. 10, 1998, pp. 151-154.

M. A. Baldo et al., "Very High-Efficiency Green Organic Light-Emitting Devices Based on Electrophosphorescence", Applied Physics Letters vol. 75, No. 1, Jul. 5, 1999, pp. 4-6.

Tsutsui et al., "High Quantum Efficiency in Organic Light-Emitting Devices with Irdium-Complex as a Triplet Emissive Center", Japanese Journal of Applied Physics vol. 38, Part 12B, Dec. 15, 1999, pp. L1502-L1504.

Radnoczi, G. et al., "Al induced crystallization of a-Si.", J. Appl. Phys. May 1, 1992, pp. 6394-6399.

Crowder et al., "Low Temperature Single Crystal Si TFT's Fabricated on Si Films processed via Sequential Lateral Solidification", IEEE Electron Device Letters, vol. 19, No. 8, Aug. 8, 1998, pp. 306-308.

Radnoczi, G. et al., "Al induced crystallization of a-Si.", J. Appl. Phys., vol. 69, No. 9., May 1, 1991, pp. 6394-6399.

* cited by examiner

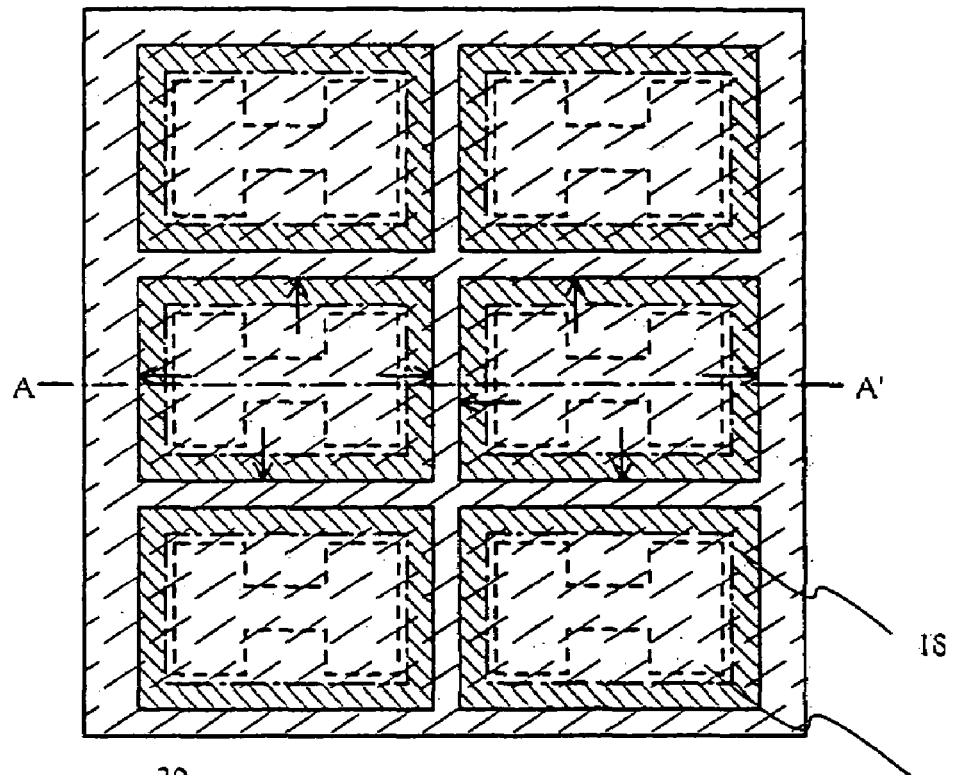
FIG. 2A
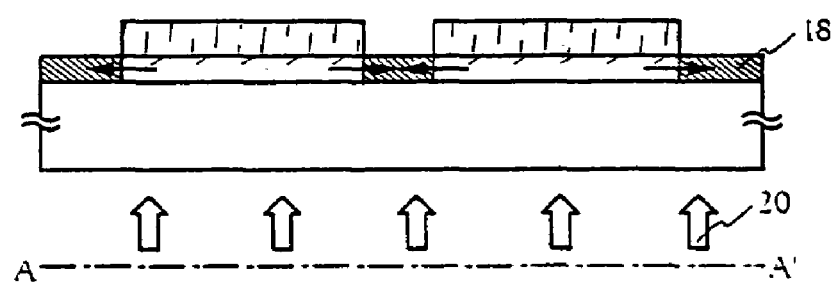
FIG. 2B
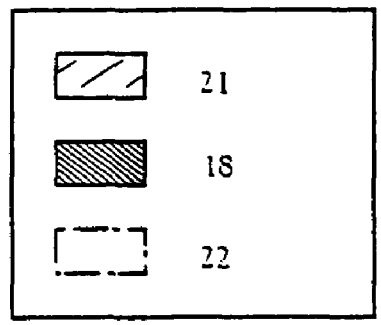

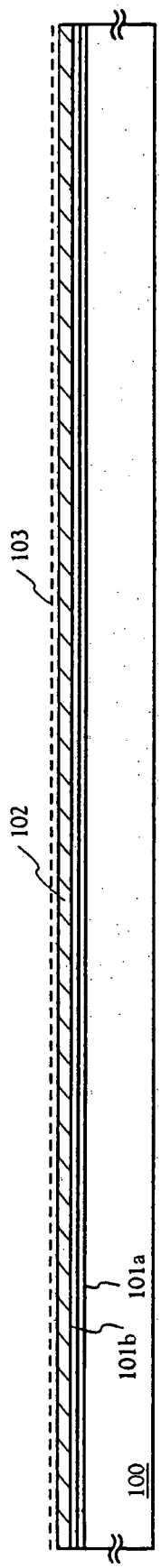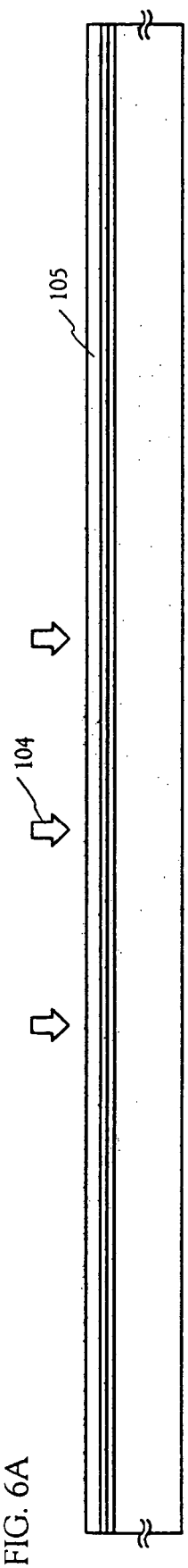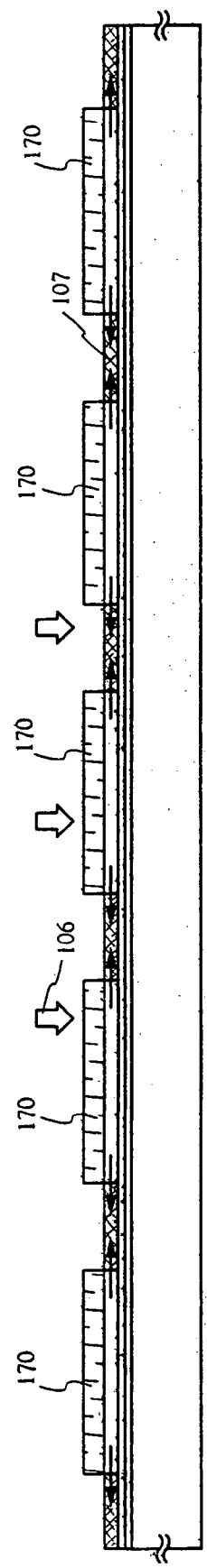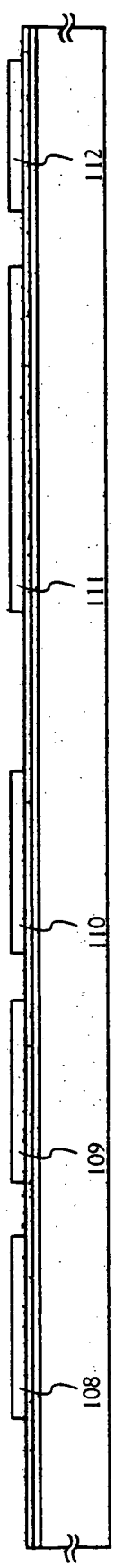
FIG. 6A
FIG. 6B
FIG. 6C
FIG. 6D

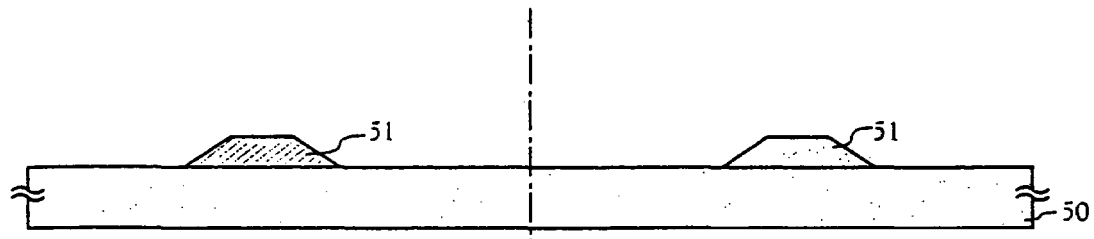
FIG. 10A
FIG. 10B
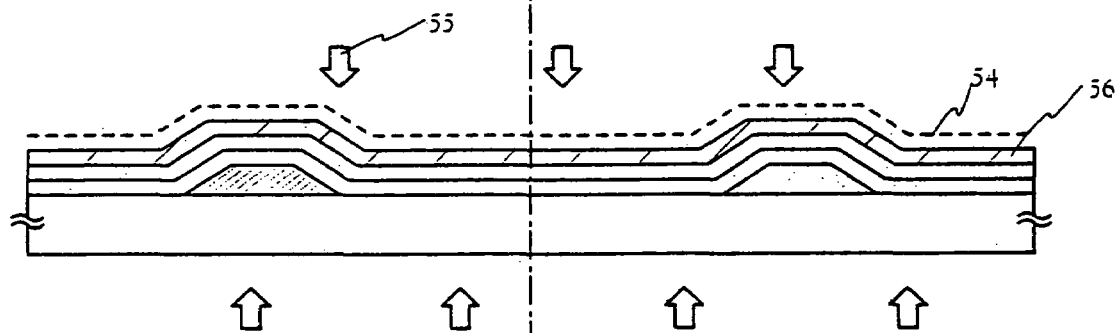
FIG. 10C
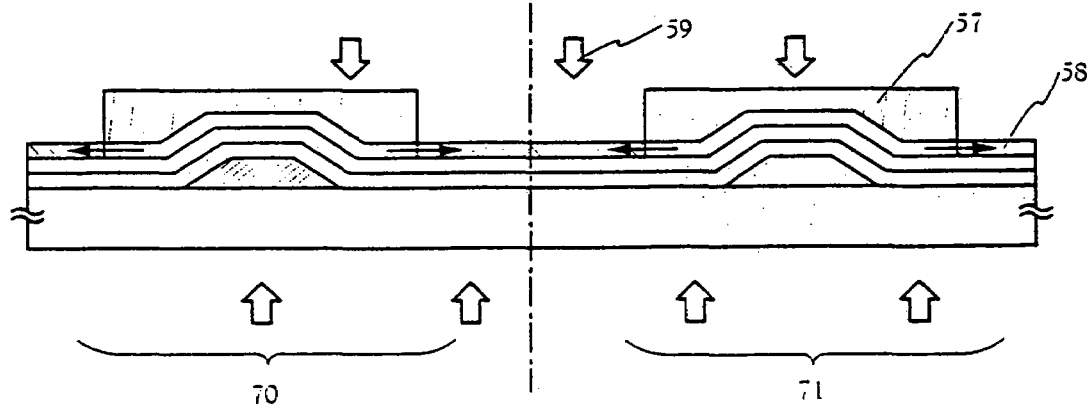
FIG. 10D

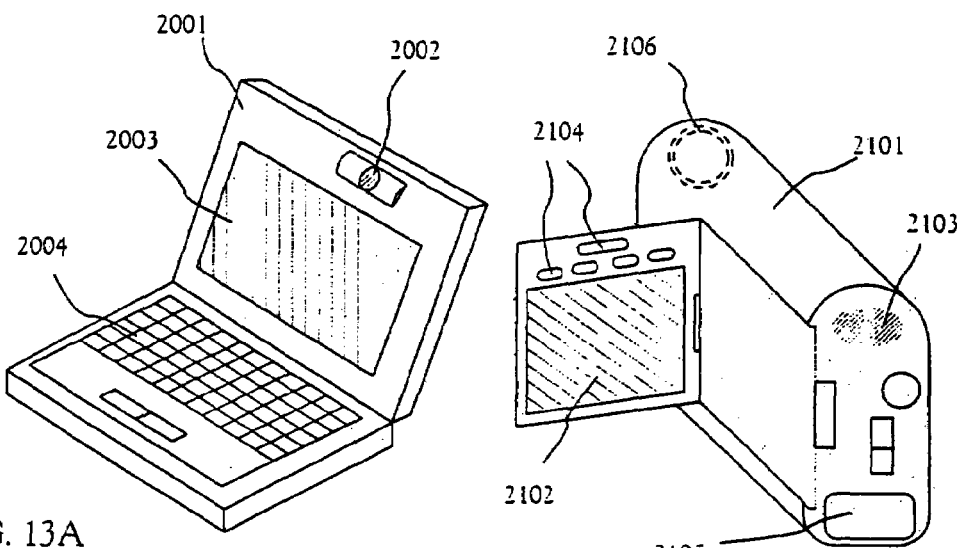
FIG. 13A
FIG. 13B
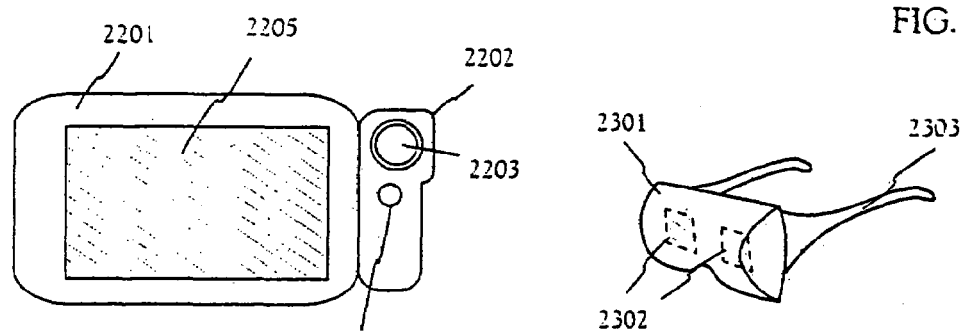
FIG. 13C
FIG. 13D
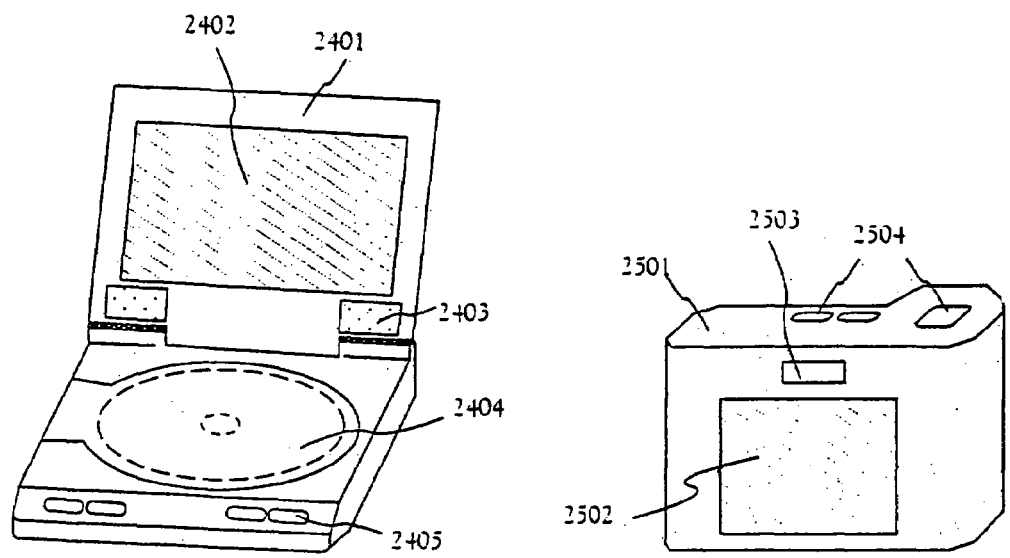
FIG. 13E
FIG. 13F

METHOD OF FABRICATING SEMICONDUCTOR DEVICE

This application is Divisional of U.S. application Ser. No. 10/882,634 filed Jul. 2, 2004; now U.S. Pat. No. 7,141,490 which is a Divisional of U.S. application Ser. No. 10/001,785 filed Dec. 5, 2001 now U.S. Pat. No. 6,759,313.

BACKGROUND OF THE INVENTION

1. Field of the Invention

The present invention relates to a method of fabricating a semiconductor device including a circuit formed of a thin film transistor (hereinafter referred to as a TFT) using a crystalline semiconductor film formed on a substrate having an insulating surface. Particularly, the present invention relates to a liquid crystal display device in which a pixel portion and a driving circuit provided at its periphery are provided on the same substrate and an electrical instrument (called electronic apparatus as well) using the liquid crystal display device as a display portion.

2. Description of the Related Art

With the rapid development of an information-oriented society, information appliances including a personal computer (PC) rapidly become popular for not only a business enterprise but also an individual. From the viewpoint of space saving of portable information equipment or a display of the PC, a liquid crystal display device (liquid crystal display) is regarded as being promising from the early days. However, there has been a problem that a manufacturing process of the liquid crystal display device is complicated and its yield is low, and accordingly manufacturing costs are high.

Besides, in recent years, from a problem of a field effect mobility, technical development of a thin film transistor (hereinafter referred to as a TFT) using a polycrystalline semiconductor film, for example, silicon as semiconductor (hereinafter referred to as a polysilicon film or a crystalline silicone film), which has a polycrystalline state obtained by crystallizing a noncrystalline semiconductor film (hereinafter referred to as an amorphous silicon film) formed on an insulating surface provided on a substrate (for example, a glass substrate, a quartz substrate, a stainless steel substrate, etc.), has been rapidly advanced. Especially, a polycrystalline silicon film prepared by carrying out a heating treatment for crystallization at a low temperature (600° C. or lower) is called a low temperature polysilicon film.

In recent years, researches have been carried out to construct a semiconductor circuit by forming TFTs on a glass substrate or the like. As an electric device such as a semiconductor circuit, an electro-optic device such as an active matrix type liquid crystal display device is typical.

The active matrix type liquid crystal display device is a monolithic display device in which a pixel matrix circuit and a driver circuit are provided over the same substrate. Further, the development of a system-on-panel having a built-in logic circuit, such as a memory circuit or a clock generating circuit, has also been advanced.

Since such a driver circuit or a logic circuit requires performing a high speed operation, it is unsuitable to use a noncrystalline silicon film (amorphous silicon film) as an active layer. Thus, in the present circumstances, a TFT including a crystalline silicon film (polysilicon film) as an active layer has become mainstream.

Then, research and development has been actively carried out as to a process, a so-called low temperature process, for forming a large area crystalline silicon film on a substrate having low heat resistance as compared with a quartz substrate, such as a glass substrate.

As a method of preparing a low temperature polysilicon film, a laser annealing method, an ion doping method, or the like is mainly used. As a method of obtaining a high quality low temperature polysilicon film, a technique using a metal element as a catalytic element for facilitating crystallization is disclosed in Japanese Patent Application Laid-open No. Hei 7-183540, etc. As the metal element, nickel (Ni), palladium (Pd), lead (Pb), tin (Sn) or the like is used. The catalytic element is added to a semiconductor (silicon) film by a method, such as a solution coating method, a sputtering method, an ion implantation method, an evaporation method, or a plasma treatment method, and a heating treatment for crystallization is carried out. However, there has been a problem that although such a treatment can be carried out at a low temperature, a treatment time is long.

The present inventors et al. disclose a technique for obtaining a crystalline silicon film on a glass substrate in Japanese Patent Application Laid-open No. Hei 7-130652. In the technique of the invention, a catalytic element for facilitating crystallization is added to an amorphous silicon film, and a heating treatment is carried out to crystallize the amorphous silicon film.

By this crystallization technique, it became possible to lower the crystallization temperature of the amorphous silicon film by 50 to 100° C., and to shorten a time required for crystallization by a factor of $\frac{1}{5}$ to $\frac{1}{10}$. As a result, it became possible to form a large area crystallized silicon film even on a glass substrate having low heat resistance. It is experimentally confirmed that the crystalline silicon film obtained by such a low temperature process has excellent crystallinity.

Besides, an environmental problem becomes more serious, and it is emergently required to take energy-saving measures with respect to electric appliances at worldwide level. Then, in order to achieve such an object as improvement of efficiency of a manufacturing process for mass production of liquid crystal cells or reduction of manufacturing costs, enlargement of a substrate in the manufacturing process is required, and technical development for obtaining a plurality of TFT substrates from a large glass substrate has been advanced.

Incidentally, in the present specification, the liquid crystal cell indicates a display device in a state where a liquid crystal is interposed between a substrate on which pixel TFTs are formed and a counter substrate.

The present applicant discloses, in Japanese Patent Application Laid-open No. Hei 7-130652, a method of fabricating a crystalline semiconductor film having high crystallinity by adding a metal element (hereinafter referred to as a catalytic element) having a function of facilitating crystallization to an amorphous semiconductor film in a crystallization step and by carrying out a heating treatment.

However, the method of the above invention is a heating treatment using a furnace, and it takes a rather long time, for example, 1 to 14 hours to carry out the heating treatment and to form the crystalline semiconductor film.

In the manufacturing process for actually mass-producing semiconductor devices, shortening of a treatment time is an important problem.

Besides, as another technique for improving the efficiency of the manufacturing process, the establishment of a technique of manufacturing a plurality of liquid crystal cells, for example, six liquid crystal cells each having a size of 12.1 inches from one large glass substrate, for example, a substrate of 550 mm×650 mm has also been advanced. In future, a technique and a manufacturing apparatus for manufacturing more liquid crystal cells from a larger glass substrate are required to be introduced. With the enlargement of a mother member (glass substrate) before treatment, an apparatus used for the manufacturing process is naturally required to be enlarged, and a furnace for carrying out the heating treatment has a problem on the enlargement of an installation area, and needs energy for uniformly and sufficiently heating the large furnace for treating the large substrate as set forth above, and there has been a problem that the energy becomes enormous electric power consumption.

Then, in view of the efficiency of manufacture and the improvement of productivity, it is conceivable that an RTA (Rapid Thermal Anneal) method is suitable as a heating method. However, the RTA method is a method in which a heating treatment of a high temperature and a short time is carried out for the purpose of suppressing the diffusion of an impurity in a semiconductor layer, and in a heating treatment step of a semiconductor film requiring the diffusion of an element, such as a crystallization step using a catalytic element or a gettering step, there is a possibility that a glass substrate is distorted before a desired effect is obtained. For example, it is confirmed that in the gettering step in a furnace, the glass substrate is curved and deformed by its own weight by merely carrying out a treatment at 800° C. for 60 seconds.

SUMMARY OF THE INVENTION

An object of the present invention is therefore to solve the above problems and to provide a method of efficiently fabricating an excellent crystalline semiconductor film on a large glass substrate in order to enable mass production using a large substrate.

It is known that when a heating treatment is carried out in a high temperature state exceeding 600° C., high speed growth of an oxidized semiconductor film due to a catalytic element occurs, and breakdown of a formed semiconductor component occurs. Further, it is known that when a heating treatment is carried out in a high temperature state exceeding 900° C., an oxidized semiconductor film grows at high speed even in a region where a catalytic element is not contained.

Another object of the present invention is therefore to shorten a time required for a process by controlling a light source to irradiate a pulsed light in a heating treatment for crystallization.

Still another object of the present invention is to reduce hydrogen in a film to improve crystallinity by carrying out a heating treatment for crystallization in a reduced pressure atmosphere. Besides, still another object of the present invention is to reduce an oxygen concentration in an atmosphere and to suppress formation of an oxide of a catalytic element for facilitating crystallization by carrying out a heating treatment in a reduced pressure atmosphere. Besides, still another object of the present invention is to facilitate crystallization and to shorten a crystallization time by carrying out a heating treatment for crystallization under vacuum. Besides, still another object of the present invention is to reduce hydrogen in a film and to improve crystallinity by carrying out a heating treatment for crystallization under vacuum. Besides, still another object of the present invention is to reduce an oxygen concentration in an atmosphere and to suppress formation of an oxide of a catalytic element for facilitating crystallization by carrying out a heating treatment under vacuum.

If a catalytic element at a high concentration remains in a semiconductor film after an excellent crystalline semiconductor film is fabricated on a glass substrate by a low temperature process, the catalytic element forms a deep energy level in the semiconductor film (silicon film) and traps a carrier and is recombined. Accordingly, if a TFT is formed by using thus obtained crystalline silicon film, it is expected that the electrical characteristics and reliability of the TFT is badly affected, which is another problem.

It is confirmed that the catalytic element remaining in the crystalline semiconductor film is segregated irregularly, especially in a crystal grain boundary concentratedly, and if this segregation exists in a region which becomes a component in the semiconductor film (especially in a channel formation region and a connection portion between the channel formation region and a source region or a drain region), it is considered that the segregation becomes an escape route (leak path) of a weak current, and causes an abrupt increase in an off current (current when a TFT is in an off state).

Yet another object of the present invention is therefore to provide a method in which a gettering step for quickly reducing the concentration of a catalytic element remaining in a crystalline semiconductor film after a crystallization step using the catalytic element is also carried out by a low temperature process.

It becomes possible to improve the throughput of the heating treatment by using an RTA apparatus as set forth above. Besides, when a light source is made to irradiate in a pulsed manner, a treatment temperature can be lowered before heat is conducted to glass, so that a heating treatment of a semiconductor film formed on a glass substrate becomes possible.

Further, heat transfer by lighting of the light source controlled in a pulsed manner is controlled through a temperature sensor, and cooling means for preventing transfer of heat exceeding the glass transition temperature to the glass substrate is used in accordance with this control. Since heating and cooling are carried out at the same time, it is possible to prevent the temperature from exceeding the glass transition temperature during the heating treatment or to shorten a time in which the temperature exceeds it. Besides, by repeating this heating treatment, even in a period in which such a temperature that a catalytic element for facilitating crystallization of a semiconductor film is diffused in the semiconductor is held, the glass substrate is not deformed, and the heating treatment of the semiconductor film for crystallization of the semiconductor film and for gettering of the catalytic element can be efficiently carried out in a relatively short time. This method is called a "Plural Pulse Thermal Annealing" (hereinafter referred to as PPTA) in the present specification.

The PPTA (Plural Pulse Thermal Anneal) apparatus uses a heating method capable of performing rapid heating and rapid cooling in which a light source is made to emit light in a pulsed manner to irradiate so that only a semiconductor film is instantaneously heated and the heating can be stopped before the heat is conducted to a glass substrate. Thus, the class substrate is not deformed or damaged by heat. Further, the heat transfer by lighting of the light source controlled in the pulsed manner is controlled with a temperature sensor, and cooling means for preventing transfer of heat exceeding the glass transition temperature to the glass substrate is used in accordance with this control. Besides, by repeating this heating treatment, even in a period in which such a temperature that a catalytic element for facilitating crystallization of the semiconductor film is diffused in the semiconductor is held, the glass substrate is not deformed, and the heating treatment of the semiconductor film for crystallization of the semiconductor film and for gettering of the catalytic element can be efficiently carried out in a relatively short time.

Incidentally, FIG. 20 shows an example of the PPTA (Plural Pulse Thermal Anneal) apparatus. In FIG. 20, a first heat treatment chamber 751, a second heat treatment chamber 752, and a third heat treatment chamber 753 are connected to the circumference of a first transport chamber 750 through gates 772d to 772f. The structure of these heat treatment chambers is the same as that of FIG. 1. A refrigerant is introduced into the respective heat treatment chambers through flow control means 767 from a cylinder 766. Exhausting means for reducing the pressure in the process chamber is constructed by turbo molecular pumps 768a to 768c and dry pumps 769a to 769c. Besides, there are provided circulators 771a to 771c for circulating the refrigerant and purifiers 770a to 770c for purifying the refrigerant. Although not shown, turning on and off of a light source and supply of the refrigerant are controlled by a computer. In the treatment chambers are equipped light sources 762a-762c and substrate stages 763a-763c, respectively.

The second transport chamber 754 is provided with transport means 760, which transports a substrate to be treated to the first treatment chamber 750, a surface treatment chamber 755, and a cooling chamber 756. The surface treatment chamber 755 is provided with a spinner 764. The cooling chamber 756 is provided with a substrate stage 765. In the structure of a load chamber 757 and an unload chamber 758, the movement of the substrate to be treated is made by transport means 761. Note, reference numeral 759 indicates transport means.

The present invention is a method of fabricating a semiconductor device using the heating treatment apparatus as described above, and is characterized by comprising a first step of adding a catalytic element for facilitating crystallization to an amorphous semiconductor film formed on an insulating, surface, and a second step of forming a crystalline semiconductor film by controlling a light source to irradiate a pulsed light to the amorphous semiconductor film to crystallize it.

Besides, the present invention is a method of fabricating a semiconductor device using the heating treatment apparatus as described above, and is characterized by comprising a first step of adding a catalytic element for facilitating crystallization to an amorphous semiconductor film formed on an insulating surface, and a second step of forming a crystalline semiconductor film by controlling a light source to irradiate a pulsed light to the amorphous semiconductor film to crystallize it, wherein a light emitting time of the light source is 1 to 60 seconds.

The above invention is characterized by comprising a step of improving crystallinity by irradiating a laser light to the crystalline semiconductor film after the second step.

The above invention is characterized in that in the second step, the inside of the treatment chamber has a reduced pressure atmosphere.

The above invention is characterized in that in the second step, an atmosphere in the treatment chamber contains oxygen at a concentration of 5 ppm or less.

Besides, the present invention is a method of fabricating a semiconductor device by using the heating treatment apparatus as described above and is characterized by comprising a first step of adding an impurity element to a crystalline semiconductor film formed by adding a catalytic element to an amorphous semiconductor film and carrying out a heating treatment, and a second step of irradiating a pulsed light to the crystalline semiconductor film added with the impurity element by controlling a light source, wherein gettering of the catalytic element is carried out by the light irradiation treatment.

Besides, the present invention is a method of fabricating a semiconductor device using the heating treatment apparatus as described above and is characterized by comprising a first step of adding an impurity element to a crystalline semiconductor film formed by adding a catalytic element to an amorphous semiconductor film and carrying out a heating treatment, and a second step of gettering the catalytic element by controlling a light source to irradiate a pulsed light to the crystalline semiconductor film added with the impurity element, wherein a light emitting time of the light source is 1 to 40 seconds.

The above invention is characterized in that the impurity element is an element belonging to group 15 of the periodic table.

The above invention is characterized in that the impurity element is an element belonging to group 15 of the periodic table and an element belonging to group 13 of the periodic table.

The above invention is characterized in that the impurity element is an element belonging to group 18 of the periodic table, an element belonging to group 15 of the periodic table, and an element belonging to group 13 of the periodic table.

The above invention is characterized in that the concentration of the impurity element belonging to the group 13 is $\frac{1}{100}$ to 100 times as high as the concentration of the impurity element belonging to the group 15.

Besides, the present invention is a method of fabricating a semiconductor device by using the heating treatment apparatus as described above and is characterized by comprising a first step of forming an amorphous semiconductor film on a crystalline semiconductor film formed by adding a catalytic element to an amorphous semiconductor film and carrying out a heating treatment, and adding an impurity element to the amorphous semiconductor film, and a second step of gettering the catalytic element by controlling a light source to irradiate a pulsed light to the crystalline semiconductor film.

The above invention is characterized in that the impurity element is an element belonging to group 18 of the periodic table.

The above invention is characterized in that the impurity element is an element belonging to group 18 of the periodic table, an element belonging to group 15 of the periodic table, and an element belonging to group 13 of the periodic table.

The above invention is characterized in that in the second step, the inside of a treatment chamber is exhausted and its pressure is 26.6 Pa or less.

The above invention is characterized in that in the second step, an atmosphere in a treatment chamber, especially in the vicinity of the crystalline semiconductor film contains oxygen at a concentration of 2 ppm or less.

The above invention is characterized in that the impurity element belonging to the group 15 of the periodic table is an element selected from N, P, As, Sb and Bi.

The above invention is characterized in that the impurity element belonging to the group 13 of the periodic table is an element selected from B, Al, Ga, In and Tl.

The above invention is characterized in that the impurity element belonging to the group 18 of the periodic table is an element selected from Ar, Kr and Xe.

The above invention is characterized in that in the second step, a continuous holding time of a temperature exceeding a glass strain point is 20 seconds or less.

The above invention is characterized in that a holding time of highest intensity of the light source in the second step is 1 to 5 seconds.

The above invention is characterized in that in the second step, cooling using a nitrogen gas, an inert gas or a liquid as a refrigerant is carried out simultaneously.

The above invention is characterized in that in the second step, a vicinity of the crystalline semiconductor film is in a nitrogen ($N_2$) atmosphere, an inert gas atmosphere, a hydrogen ($H_2$) atmosphere, or a reducing gas atmosphere.

The above invention is characterized in that the light source is a light source for emitting infrared light or ultraviolet light.

The above invention is characterized in that a halogen lamp, a metal halide lamp, a xenon arc lamp, or a reduced pressure mercuric lamp is used as the light source.

The above invention is characterized in that the light source irradiates an upper side of the substrate, a lower side of the substrate, or the lower side and the upper side of the substrate.

The above invention is characterized in that the catalytic element is one or plural kinds of elements selected from Ni, Fe, Co, Ru, Rh, Pd, Os, Ir, Pt, Cu, and Au.

Besides, the present invention is a method of fabricating a semiconductor device using the heating treatment apparatus as described above and is characterized by comprising a first step of forming an amorphous semiconductor film on an insulating surface, a second step of adding a catalytic element for facilitating crystallization to a surface of the amorphous semiconductor film, a third step of forming a crystalline semiconductor film by controlling a light source to irradiate a pulsed light to the amorphous semiconductor film added with the catalytic element to crystallize the amorphous semiconductor film, a fourth step of adding an impurity element to the crystalline semiconductor film, and a fifth step of gettering the catalytic element by controlling the light source to irradiate a pulsed light to the crystalline semiconductor film added with the impurity element.

Besides, the present invention is a method of fabricating a semiconductor device using the heating treatment apparatus as described above and is characterized by comprising a first step of forming an amorphous semiconductor film on an insulating surface, a second step of forming a catalytic element inclusion region by coating a catalytic element for facilitating crystallization onto a surface of the amorphous semiconductor film, a third step of forming a crystalline semiconductor film by controlling a light source to irradiate a pulsed light to the amorphous semiconductor film coated with the catalytic element to crystallize the amorphous semiconductor film, a fourth step of adding an impurity element to the crystalline semiconductor film, a fifth step of gettering the catalytic element by controlling the light source to irradiate a pulsed light to the crystalline semiconductor film added with the impurity element, a sixth step of transforming the crystalline semiconductor film in which the catalytic element has been gettered in the fifth step into a semiconductor layer of a desired shape, a seventh step of forming a gate insulating film covering the semiconductor layer, an eighth step of forming a gate electrode on the gate insulating film, a ninth step of adding an n-type impurity element to the semiconductor layer, a tenth step of adding a p-type impurity element to the semiconductor layer which becomes an active layer of a subsequent p-channel TFT, and an eleventh step of activating the impurity elements added to the semiconductor layer by controlling the light source to irradiate a pulsed light.

The above invention is characterized in that the crystallizing step of the semiconductor layer and the activating step of the impurity elements added to the semiconductor layer are carried out in a reduced pressure atmosphere in which an oxygen concentration is reduced by performing exhaustion by a rotary pump and a mechanical booster pump.

The above invention is characterized in that the impurity element added in the fourth step is an impurity element belonging to group 15 of the periodic table, and the impurity element belonging to the group 15 of the periodic table is an element selected from N, P, As, Sb and Bi.

The above invention is characterized in that the impurity element added in the fourth step is an impurity element belonging to group 15 of the periodic table and an element belonging to group 13 of the periodic table, and the impurity element belonging to the group 15 of the periodic table is an element selected from N, P, As, Sb and Bi, and the element belonging to the group 13 of the periodic table is an element selected from B, Al, Ga, In and Tl.

The above invention is characterized in that the third step and the fifth step are carried out under a condition that a vicinity of the crystalline semiconductor film has a nitrogen ($N_2$) atmosphere, an inert gas atmosphere, a hydrogen ($H_2$) atmosphere, or a reducing gas atmosphere.

The above invention is characterized in that the catalytic element is one kind or plural kinds of elements selected from Ni, Fe, Co, Ru, Rh, Pd, Os, Ir, Pt, Cu, and Au.

By carrying out the crystallization treatment of the semiconductor film and the movement (gettering) treatment of the catalytic element existing in the semiconductor film by using the apparatus as described above, it becomes possible to shorten a time required for the crystallizing step of the semiconductor film and a time required for the gettering step of the catalytic element added to the semiconductor film.

BRIEF DESCRIPTION OF THE DRAWINGS

FIGS. 2A and 2B are views for explaining a heating treatment (gettering) disclosed in the present invention;

FIGS. 6A to 6D are views showing fabricating steps of TFTs of Embodiment 1;

FIGS. 10A to 10D are views showing fabricating steps of TFTs of Embodiment 2;

FIGS. 13A to 13F are views showing examples of electronic instruments of Embodiment 8;

DETAILED DESCRIPTION OF THE PREFERRED EMBODIMENTS

Embodiment Mode 1

Figure 1A:
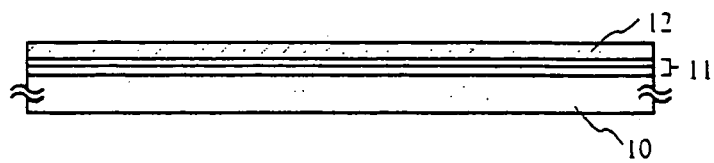
FIGS. 1A to 1F are views for explaining a heating treatment (crystallization, gettering) disclosed in the present invention.

A crystallization method and a gettering method using a PPTA apparatus disclosed in the present invention will be described with reference to FIGS. 1A to 1F.

First, an under insulating film 11 is formed on an insulating surface of a glass substrate 10 transparent to light. As the under insulating film, any one of a silicon oxide film, a silicon nitride film, and a silicon nitride oxide film may be used, or these films may be laminated.

Next, an amorphous semiconductor film 12 is formed on the under insulating film 11. In Embodiment Mode 1, an amorphous silicon film was formed to a thickness of 55 nm. Subsequently, as a catalytic element for facilitating crystallization, nickel (Ni) is coated onto the surface of the amorphous silicon film 12 by a well-known method, and a catalytic element containing layer 13 is formed.

This substrate is moved to a treatment chamber 14, and a heating treatment is carried out. As the heating treatment, eleven halogen lamps (infrared light) located at the lower side of the substrate and ten halogen lamps at the upper side are switched on for 1 to 60 seconds (preferably 30 to 60 seconds) and 1 to 10 times (preferably 2 to 6 times). FIG. 4A shows the intensity of the light source during the heating treatment, a solid line graph of FIG. 4B shows temperature in the vicinity of the substrate measured by a thermocouple (508b of FIG. 3) of the PPTA apparatus embedded in a silicon wafer, and a dotted line graph of FIG. 4B shows temperature measured by a radiation thermometer (508a of FIG. 3) at the outside of the treatment chamber from the rear side of the center portion of the substrate. From these graphs, it is conceivable that heat (measured by the thermocouple embedded in the silicon wafer) supplied by the halogen lamp is 700 to 1300° C. In Embodiment Mode 1, although the halogen lamp is used as the light source, it is also preferable to use an ultraviolet lamp, such as a xenon lamp, as the light source.

Figure 3:
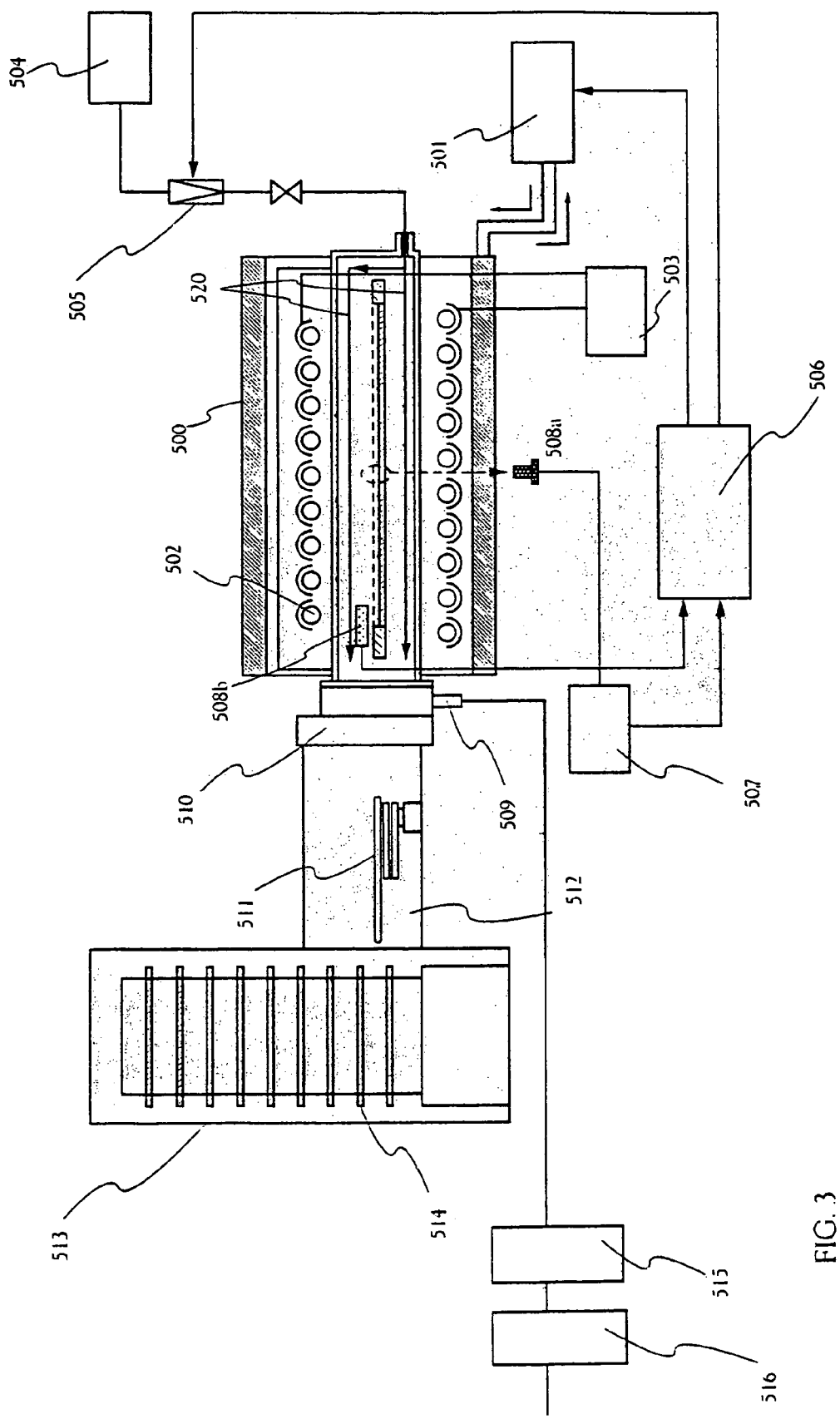
FIG. 3 is a view showing an example of a heating treatment apparatus used in the present invention.
Figure 4A:
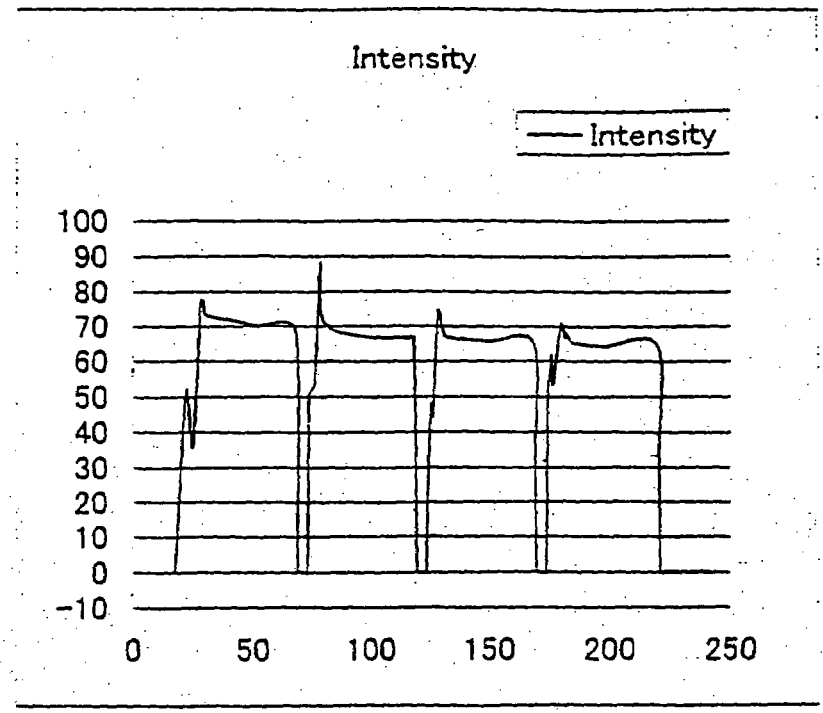
FIGS. 4A and 4B are a view showing measurement results of intensity change of a light source and a view showing measurement results of temperature change of a semiconductor film and a substrate, respectively, of the present invention.
Figure 4B:
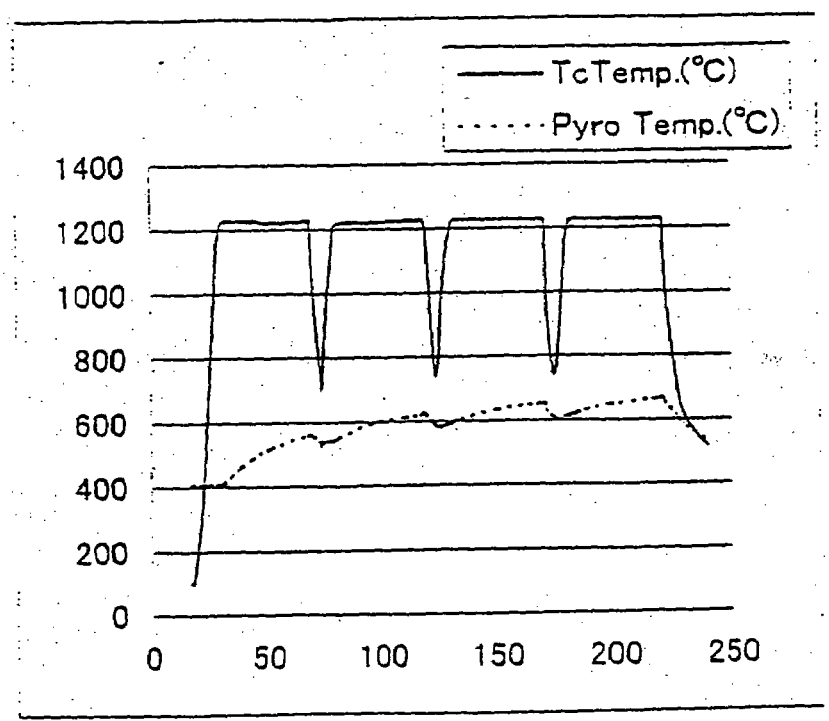

Incidentally, as shown in FIG. 3, the PPTA apparatus disclosed in the present specification is provided with, as cooling means, means for cooling the inside of a reaction chamber and the reaction chamber. Here, the light source is controlled in a pulsed manner to irradiate the semiconductor film and to heat-treat the semiconductor film, and at the same time, cooling is performed by using a refrigerant so that the glass substrate is not distorted. As the refrigerant for cooling the inside of the reaction chamber, an inert gas such as a nitrogen gas or a helium gas may be used, and as the refrigerant for cooling the reaction chamber itself, an inert gas such as a nitrogen gas or a helium gas, or a liquid or both may be used. In Embodiment Mode 1, the nitrogen gas of 2 to 10 (slm) is made to flow in.

As the lamp used as the light source, as long as the temperature can be controlled in a pulsed manner as shown by the graph of FIG. 4B, not only the infrared light, but also a lamp emitting ultraviolet light, or any one of a general metal halide lamp, a xenon arc lamp, and a reduced pressure mercury lamp may be used.

Further, the heating treatment for crystallization is further effective if exhaustion is performed by using a rotary pump, a mechanical booster pump and the like and the heat treatment is carried out in a reduced pressure atmosphere in which an oxygen concentration is reduced. It is appropriate that the pressure in the treatment chamber is made $1.33 \times 10^4$ Pa or less. Alternatively, it may be 26.7 Pa to $1.33 \times 10^4$ Pa. Further, it may be 13.3 Pa or less.

Figure 5A:
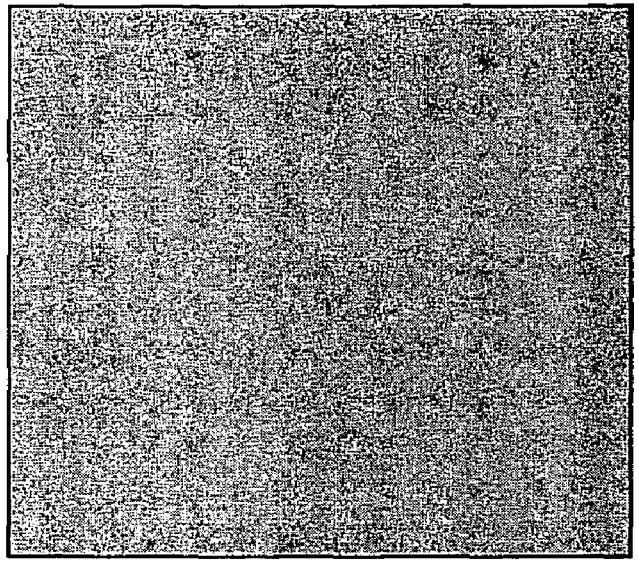
FIGS. 5A and 5B are views showing results of observation of a crystalline semiconductor film fabricated by using the present invention.
Figure 5B:
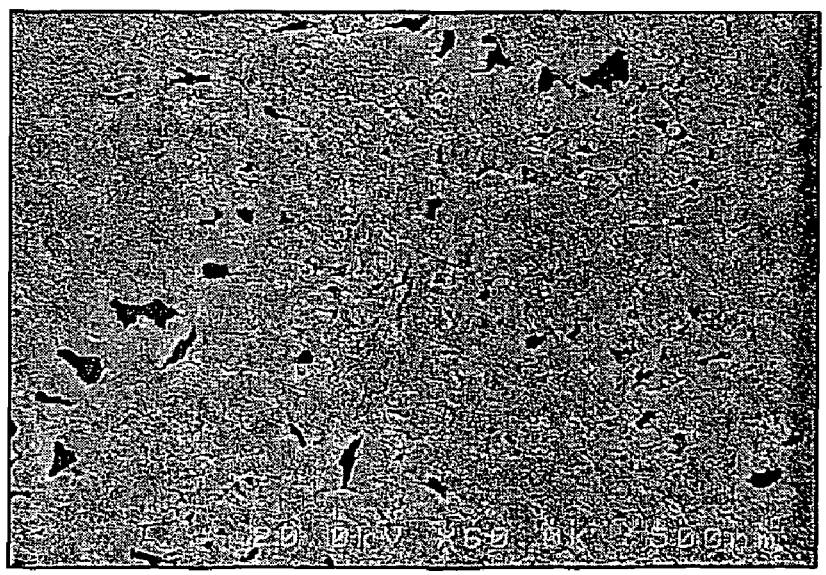

FIG. 5A shows a state in which a crystalline silicon film 16, which is obtained through crystallization by the PPTA apparatus, is observed by an optical microscope. FIG. 5B shows the result of an observation, made by a SEM, of a grain boundary of a semiconductor film treated by secoetching. In FIG. 5A, the observation is made in a transmission mode of the optical microscope, and from the difference between transmissivity of crystalline silicon and that of amorphous silicon, it is conceivable that a black portion is a region of amorphous silicon. There are few regions which seem to be amorphous silicon as it is. Here, in order to observe the state of crystallization, an image processing was further carried out and a crystallization rate was measured.

A photograph taken after the observation by the optical microscope is made to have two gradations bit the image processing. Since amorphous silicon and crystalline silicon can be separated in green, the photograph was made a green image, and this image was made to have two gradations to be divided into an amorphous silicon region and a crystalline silicon region, and then a calculation was made using image processing software (NIH-Image). According to this measurement method, the crystallization rate was 99.8%.

Figure 1B:
Figure 1C:
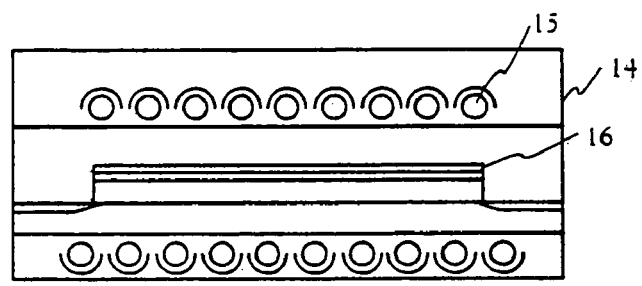

Next, a gettering treatment using the PPTA apparatus will be described with reference to FIGS. 1D and 1E and FIG. 2. A mask insulating film 17 is formed in order to add an impurity element (typically phosphorus) belonging to the group 15 of the periodic table and having a gettering function to a crystalline silicon film 16, and phosphorus (P) is added to form a gettering region 18. In this gettering region 18, phosphorus of $1 \times 10^{20}$ to $1 \times 10^{21}$ atoms/m³ is added. Incidentally, as the impurity element belonging to the group 15 of the periodic table, an element selected from N, P, As, Sb and Bi may be used.

The catalytic element is coated on the whole surface of the semiconductor film, and the catalytic element of $1 \times 10^{17}$ to $1 \times 10^{19}$ atoms/cm³ remains even in a region which becomes a subsequent channel formation region. A lamp light is transformed into a pulse state and is irradiated to the lower surface and the upper surface of the substrate (hereinafter, a lamp light which is transformed into a pulse state and is irradiated is referred to as a pulsed light) to cause the gettering region 18 to getter the catalytic element. Similarly to the heating treatment for crystallization, a halogen lamp is used for the pulsed light, heating up to 1220° C. is performed, and the temperature is held for 40 seconds. Next, cooling is performed down to 300 to 400° C. Although the effect of gettering can be confirmed by only one such treatment, the treatment is preferably performed 2 to 20 times. By this heating treatment, the catalytic element in the semiconductor film can be reduced to $1 \times 10^{17}$ atoms/cm³ or less. During the heating treatment, in order to prevent heat from being conducted to the glass substrate, the nitrogen gas of 2 to 10 (slm) as the refrigerant is made to flow into the reaction chamber. Incidentally, similarly to the heating treatment for crystallization, if the heating treatment for gettering is also carried out in a reduced pressure atmosphere lower than the atmospheric pressure by performing exhaustion by the rotary pump and the mechanical booster pump, the efficiency of gettering is further improved.

In the above heating treatment, although the lamp light is irradiated to the semiconductor film in the pulsed manner to carry out the treatment such as crystallization or gettering, if heating is performed like a pulse (for example, the light source itself is moved or the substrate itself is moved to produce the same effect as that obtained by irradiating the semiconductor film with that pulsed light), it is not necessary to control the light source (lamp) in the pulsed manner.

Here, an example of the PPTA apparatus used in the present invention will be described in brief with reference to FIG. 3. The apparatus is a single wafer processing type and a treatment chamber 500 is formed of quartz. A water-cooled cooling device 501 for cooling is provided around the treatment chamber 500. As light sources 502, rod-like halogen lamps are provided at the lower side and the upper side of a substrate, and the light sources at both sides are used in Embodiment Mode 1. However, the light sources may be used only at a single side, and the user may suitably choose a structure. The light sources 502 are controlled by a light source control device 503 and emits a pulsed light (including, for example, a wavelength of 0.5 μm to 3 μm).

A nitrogen gas as a refrigerant (gas) 520 is supplied to the treatment chamber 500 from a refrigerant suppler source 504 through a flow control device 505. Incidentally, on the basis of results measured by temperature sensors 508a and 508b connected to a temperature detector 507, control means 506 controls the supply amount of the refrigerant and the intensity of the light source. The refrigerant supplied to the treatment chamber 500 is exhausted to the outside from an exhaustion port 509, and the treatment chamber 500 is always filled with a clean gas.

A substrate 514 is set on a substrate holder in a loader/unloader chamber 513, and is transported to the treatment chamber 500 by transport means 511 of a transport chamber 512. A partition valve 510 is provided between the transport chamber 512 and the treatment chamber 500. The treatment chamber 500 is exhausted by a rotary pump 515 and a mechanical booster pump 516.

Embodiment Mode 2

In the crystallization step of an amorphous semiconductor set forth in Embodiment Mode 1, the heating treatment for crystallization of an amorphous semiconductor film may be carried out in a vacuum atmosphere of 0.1 Pa or lower. In this case, a pump capable of realizing a high vacuum, such as a turbo molecular pump, is used to highly evacuate the inside of the treatment chamber, and then, the light source is controlled to carry out the heating treatment.

Embodiment Mode 3

In Embodiment Mode 3, an example different from the gettering method using the PPTA apparatus of Embodiment Mode 1 will be described. Incidentally, since a different point is an impurity element added to a gettering region, FIGS. 1A-1F are used for the description.

In accordance with Embodiment Mode 1, an under insulating film 11 is formed on an insulating surface of a glass substrate 10 transparent to light. Next, an amorphous semiconductor film 12 is formed on the under insulating film 11. In Embodiment Mode 3, an amorphous silicon film was formed to a thickness of 55 nm (FIG. 1A).

Subsequently, nickel (Ni) as a catalytic element for facilitating crystallization is coated onto the surface of the amorphous silicon film 12 by a well-known method to form a catalytic element containing layer 13, and then, the amorphous silicon film 12 is crystallized by a heating treatment in a treatment chamber 14 to form a crystalline silicon film 16. Laser light may be irradiated to the crystalline silicon film 16 after this heating treatment to improve the crystallinity (FIGS. 1B and 1C).

The concentration of the cataleptic element remaining in the crystalline silicon film 16 formed in the manner described above is thus reduced. A gettering treatment using the PPTA apparatus will be described with reference to FIGS. 1D and 1E and FIGS. 2A-2B. Note, FIG. 2B shows a sectional view of FIG. 2A with a cut line A-A'. A mask insulating film 17 is formed to add an impurity element (typically phosphorus) belonging to the group 15 of the periodic table and having a gettering function and an impurity element belonging to the group 13 to the crystalline silicon film 16, and phosphorus (P) and boron (B) are added to form a gettering region 18. In this gettering region 18, the concentration of the impurity element belonging to the group 13 is 1/100 to 100 times as high as the concentration of the impurity element belonging to the group 15 (in Embodiment Mode 3, phosphorus of $1\times10^{19}$ to $1\times10^{21}$ atoms/cm$^3$ and boron of $1\times10^{19}$ to $1\times10^{21}$ atoms/cm$^3$ are added). A vapor phase method such as an ion doping method or a plasma doping method, or a method of forming a layer containing the element belonging to the group 13 and/or group 15 by a solid phase method or a liquid phase method using a solution is used as the adding method. Incidentally, as the impurity element belonging to the group 15 of the periodic table, an element selected from N, P, As, Sb and Bi may be used, and as the element belonging to the group 13 of the periodic table, an element selected from B, Al, Ga, In and Tl may be used.

This substrate is again moved to the treatment chamber 14 and the heating treatment is carried out. As the heating treatment, eleven halogen lamps (infrared light) located at the lower side of the substrate and ten halogen lamps at the upper side are switched on for 1 to 180 seconds (preferably 30 to 60 seconds) and 1 to 30 times (preferably 2 to 10 times). The treatment is carried out at such a temperature that the glass substrate is not largely distorted or warped. In Embodiment Mode 3, on the basis of measurement from the rear surface of the substrate by a radiation thermometer, control is made so that the substrate temperature at this time becomes 700° C. or lower, and continuous holding of the temperature above 667° C. as the glass strain point is suppressed within 20 seconds. In Embodiment Mode 3, although the halogen lamp is used as the light source, it is preferable to use an ultraviolet lamp, such as a xenon lamp, as the light source.

Incidentally, as shown in FIG. 3, the PPTA apparatus disclosed in the present specification is provided with, as cooling means, means for cooling the inside of the reaction chamber and the reaction chamber, and the light source is controlled in the pulsed manner to irradiate the semiconductor film and to heat-treat the semiconductor film, and at the same time, cooling is performed by using the refrigerant so that the glass substrate is not distorted. As the refrigerant in the reaction chamber, an inert gas such as a nitrogen gas or a helium gas may be used, and as the refrigerant for cooling the reaction chamber itself, an inert gas such as a nitrogen gas or a helium gas, or a liquid, or both may be used. In Embodiment Mode 3, the nitrogen gas of 2 to 10 (slm) is made to flow in.

As the lamp used as the light source, as long as the illumination can be controlled in the pulsed manner, not only the infrared light, hut also a lamp emitting ultraviolet light, or any one of a general metal halide lamp, a xenon arc lamp, a carbon arc lamp, and a reduced pressure mercury lamp may be used.

Further, the gettering effect is improved by carrying out the heating treatment in a reduced pressure atmosphere lower than the atmospheric pressure by performing exhaustion by the rotary pump and the mechanical booster pump. In Embodiment Mode 3, nitrogen having high purity (concentration of $CH_4$, CO, $CO_2$, $H_2$, $H_2O$ and $O_2$ contained in nitrogen is 1 ppb or less) is made to flow at a rate of 5 l/min to hold the pressure at 26.7 Pa or less, and a nitrogen atmosphere of an oxygen concentration of 5 ppm or less (in Embodiment Mode 3, 2 ppm or less) is formed. The heating treatment step at 450 to 950° C. for 4 to 24 hours is carried out in this nitrogen atmosphere. Incidentally, in Embodiment Mode 3, although the nitrogen atmosphere is used, if the oxygen concentration can be made 5 ppm or less, the atmosphere may contain a gas not containing oxygen, for example, an inert gas such as helium (He), neon (Ne), or argon (Ar). Besides, a as which is not deposited by decomposition due to heat or does not react with the semiconductor film, for example, hydrogen ($H_2$) may be used.

The catalytic element is coated on the whole surface of the semiconductor film 21, and the catalytic element of $1\times10^{17}$ to $1\times10^{19}$ atoms/$cm^3$ remains even in a region which subsequently becomes a channel formation region. The lamp light is transformed into a pulse state and is irradiated to the lower surface and the upper surface of the substrate (hereinafter, a lamp light which is transformed into the pulse state and is irradiated is referred to as a pulsed light 20), and the gettering region 18 is made to getter the catalytic element. The halogen lamp is used for the pulsed light 20, and lamp heating up to 700° C. is performed and immediately after that, cooling is performed down to 600° C. (preferably 450° C. or lower). Although the effect of gettering can be confirmed even when this treatment is performed only once, the treatment is preferably performed 2 to 30 times.

Figure 1D:
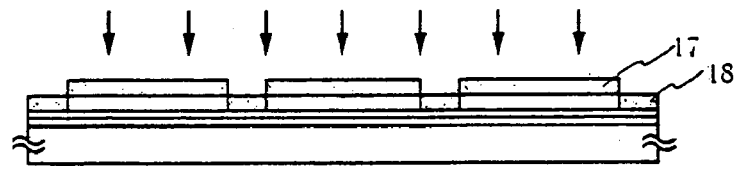
Figure 1E:
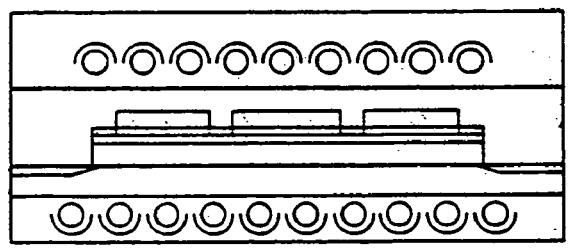
Figure 1F:
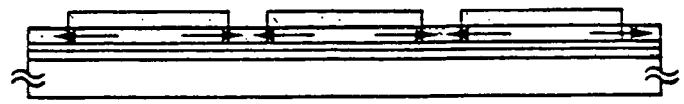

By this heating treatment, as shown in FIG. 1F and FIGS. 2A-2B, nickel in the crystalline silicon film is moved in the direction of an arrow at this heating treatment step, and is trapped by the gettering function into the gettering region 18. That is, nickel is removed from the crystalline silicon film, and the concentration of nickel contained in the crystalline silicon film can be reduced to $1\times10^{17}$ atoms/$cm^3$ or less, preferably to $1\times10^{16}$ atoms/$cm^3$ or less. During the heating treatment, in order to prevent heat from being conducted to the glass substrate, a nitrogen gas of 2 to 10 (slm) as the refrigerant is made to flow into the reaction chamber.

In the above-described heating treatment, although the semiconductor film is irradiated with the lamp light in the pulsed manner and the treatment such as crystallization or gettering is carried out, if heating is performed like a pulse (for example, the light source itself is moved or the substrate itself is moved to produce the same effect as that obtained by irradiating the semiconductor film with the pulsed light), it is not necessary to control the light source (lamp) in the pulsed manner. The crystalline silicon film thus obtained is patterned to form a region 22 to be an active layer of a TFT later.

Embodiment Mode 4

In Embodiment Mode 4, an example different from the gettering method using the PPTA apparatus of Embodiment Mode 3 using FIGS. 1A-1F will be described.

In accordance with Embodiment Mode 1, a crystalline semiconductor film is formed by using a catalytic element. Note that, the crystallinity may be improved by irradiating a laser light to the crystalline semiconductor film (crystalline silicon film) obtained by the heating treatment.

In the crystalline silicon film formed in the manner described above, the catalytic element for facilitating crystallization is used, and the catalytic element is removed after crystallization by the gettering function of phosphorus, and a more excellent crystalline silicon film can be obtained by reducing the concentration of the catalytic element remaining in the crystalline silicon film.

Here, the gettering treatment using the PPTA apparatus will be described. A mask film 17 is formed to add an impurity element (typically phosphorus) belonging to the group 15 of the periodic table and having the gettering function, an impurity element (typically boron) belonging to the group 13 of the periodic table, and an impurity element (typically argon) belonging to the group 18 of the periodic table to a crystalline silicon film 16, and phosphorus (P) and argon (Ar) are added to form a gettering region 18. At this time, although the gettering region 18 may be formed by adding phosphorus (P) and boron (B), in this case, the concentration of the impurity element belonging to the group 13 in this gettering region 18 is 1/100 or more to 100 or less times as high as the concentration of the impurity element belonging to the group 15 (in Embodiment Mode 4, phosphorus of $1\times10^{19}$ to $1\times10^{21}$ atoms/$cm^3$ and boron of $1\times10^{19}$ to $1\times10^{21}$ atoms/$cm^3$ are added). A vapor phase method such as an ion doping method or a plasma doping method, or a method of forming a layer containing an element belonging to the group 13 and/or group 15 by a solid phase method or a liquid phase method using a solution is used as the adding method Argon (Ar) may be mixed into a film when a semiconductor film is deposited by sputtering. Further, as the gettering method, an amorphous semiconductor film may be formed so as to be adjacent to a region to be gettered.

Note that, as the impurity element belonging to the group 18 of the periodic table, Kr, Xe or the like may be used in addition to Ar.

Figure 21:
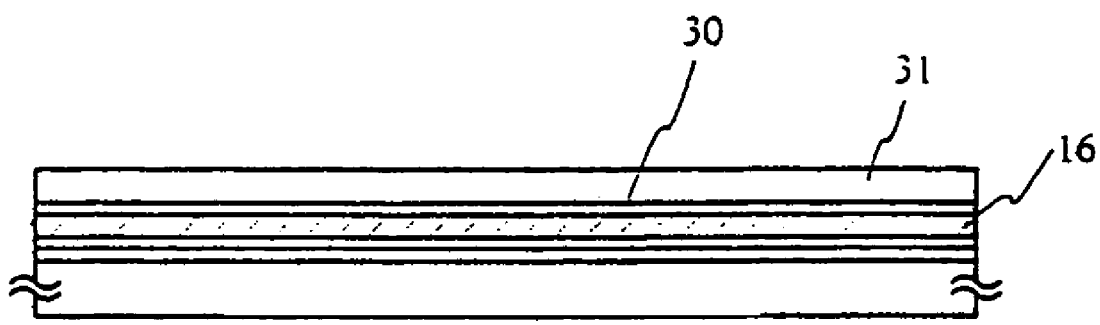
FIG. 21 is a view of showing fabricating steps of TFTs of Embodiment 1.

Further, after the catalytic element is added and the crystalline silicon film 16 is formed by heating as shown in FIGS. 1C and 1D, then, as shown in FIG. 21, an amorphous silicon film containing an impurity element belonging to the group 18 of the periodic table is formed on the crystalline silicon film 16 and a heating treatment is performed, so that this amorphous silicon film functions as a gettering region, and the catalytic element remaining in the crystalline silicon film 16 can be moved. Note that, since the amorphous silicon film 31 functioning as the gettering region is removed by etching or the like after the gettering step, it is appropriate that the amorphous silicon film 31 is formed after a barrier layer 30 for protecting the crystalline silicon film against an etchant at the etching treatment is formed on the crystalline silicon film 16. Note that, a chemical oxide film formed by a treatment with ozone water or a chemical oxide film formed by a treatment with a solution of a mixture of sulfuric acid, hydrochloric acid, nitric acid, or the like and hydrogen peroxide water may be used as this barrier layer 30. These films can be removed by a hydrofluoric acid treatment.

This substrate is again moved into the treatment chamber 14 and a heating treatment is carried out. As the heating treatment, eleven halogen lamps (infrared light) 15 installed at the lower side of the substrate and ten halogen lamps at the upper side thereof are switched on for 1 to 180 seconds (preferably 30 to 60 seconds) and 1 to 30 times (preferably 2 to 10 times) The treatment is carried out at such a temperature that the glass substrate is not largely distorted or warped. In Embodiment Mode 4, on the basis of measurement from the rear surface of the substrate by the radiation thermometer, control is made so that the substrate temperature at this time becomes 700° C. or lower, and continuous holding of a temperature not smaller than 667° C. as the glass strain point is suppressed within 20 seconds. Besides, in order to improve a throughput and to reduce electric power consumption, light irradiation may be carried out for several minutes to hold a temperature of 600 to 700° C. In Embodiment Mode 4, although the halogen lamp is used as the light source, it is also preferable to use an ultraviolet lamp, such as a xenon lamp, as the light source.

Note that, as shown in FIG. 3, the PPTA apparatus disclosed in the present specification is provided with, as cooling means, means for cooling the inside of the reaction chamber and the reaction chamber. Here, the tight source is controlled in the pulsed manner to irradiate the semiconductor film and to subject the semiconductor film to the heat treatment, and at the same time, cooling is performed by using the refrigerant so that the glass substrate is not distorted. As the refrigerant in the reaction chamber, an inert gas such as a nitrogen gas or a helium gas may be used, and as the refrigerant for cooling the reaction chamber itself, an inert gas such as a nitrogen gas or a helium gas, or a liquid, or both may be used. In Embodiment Mode 4, the nitrogen gas of 2 to 10 (slm) is made to flow in.

As the lamp used as the light source, as long as the illumination can be controlled abruptly in the pulsed manner, not only the infrared light, but also a lamp emitting ultraviolet light, or any one of a general halogen lamp, a metal halide lamp, a xenon arc lamp, a carbon arc lamp, and a reduced pressure mercury lamp may be used.

Further, in the treatment chamber 14, exhaustion is performed by using the rotary pump and the mechanical booster pump, and the heating treatment is carried out in the reduced pressure atmosphere lower than the atmospheric pressure so that the gettering effect is improved. In Embodiment Mode 4, nitrogen having high purity (concentration of $CH_4$, $CO$, $CO_2$, $H_2$, $H_2O$ and $O_2$ contained in nitrogen is 1 ppb or less) is made to flow at a rate of 5 l/min to hold a pressure of 26.7 Pa or less, and the nitrogen atmosphere of an oxygen concentration of 5 ppm or less (in Embodiment Mode 4, 2 ppm or less) is formed. In this nitrogen atmosphere, the heating treatment step at 450° C. to 950° C. for 4 to 24 hours is carried out. Note that, in Embodiment Mode 4, although the nitrogen atmosphere is used, if the oxygen concentration can be made 5 ppm or less, the atmosphere may contain a gas not containing oxygen, for example, an inert gas such as helium (He), neon (Ne), or argon (Ar). Besides, a gas which is not deposited by decomposition due to heat or does not react with the semiconductor film, for example, hydrogen ($H_2$) may be used.

The catalytic element is applied onto the whole surface of the semiconductor film, and the catalytic element of $1 \times 10^{17}$ to $1 \times 10^{19}$ atoms/cm$^3$ remains even in a region which becomes a subsequent channel formation reunion. The lamp light is transformed into the pulse state and is irradiated from the lower surface and the upper surface of the substrate (hereinafter, the lamp light which is transformed into the pulse state and is irradiated is referred to as a pulsed light), and the gettering region 18 is made to getter the catalytic element. The halogen lamp is used as the pulsed light, and lamp is heated up to 700° C. and immediately after that, is cooled down to 600° C. (preferably 450° C. or lower). Although the effect of gettering can be confirmed even when this treatment is carried out only once, the treatment is preferably carried out 2 to 30 times. Besides, for the purpose of improving throughput and reducing electric power consumption, optical irradiation may be carried out for several minutes to hold a temperature of 600° C. to 700° C.

By this heating treatment, as shown in FIG. 1F, nickel in the crystalline silicon film is moved in the direction of an arrow at this heating treatment step, and is trapped by the gettering function of phosphorus into the gettering region 18. That is, nickel is removed from the crystalline silicon film, and the concentration of nickel contained in the crystalline silicon film can be reduced to $1 \times 10^{17}$ atoms/cm$^3$ or less, preferably to $1 \times 10^{16}$ atoms/cm$^3$ or less. During the heating treatment, in order to prevent heat from being conducted to the glass substrate, the nitrogen gas of 2 to 10 (slm) as the refrigerant is made to flow into the reaction chamber.

In the above-described heating treatment, although the semiconductor film is irradiated with the lamp light in the pulsed manner and the treatment such as crystallization or gettering is carried out, if heating is performed like a pulse (for example, the light source itself is moved or the substrate itself is moved to produce the same effect as that obtained by irradiating the semiconductor film with the pulsed light), it is not necessary to control the light source (lamp) in the pulsed manner.

Embodiment 1

An example of a method of fabricating a TFT substrate using the present invention will be described in Embodiment 1 with reference to FIGS. 6A to 9.

First, in Embodiment 1, a glass substrate made of aluminoborosilicate glass, barium borosilicate glass, or the like transparent to light, or a glass substrate having a specific gravity of 2.5 g/cm$^3$ or less and a thermal expansion coefficient of $35.0 \times 10^{-7}$/° C. or less is used. An underlying insulating film 101 is formed on the glass substrate 100. As the underlying insulating film 101, $SiH_4$ and $N_2O$ are used in a CVD apparatus to form a silicon nitride oxide (SiNO) film 101a, and next, a silicon oxide nitride (SiON) film 101b is formed in the same chamber. The films are formed so that the film thickness of the laminate of the SiNO film and the SiON film becomes 50 to 200 nm.

Next, an amorphous silicon film 102 is formed as an amorphous semiconductor film. Next, a mask insulating film (not shown) is formed on the amorphous silicon film 102. The mask insulating film is used in a step in which an impurity element for imparting a p type (hereinafter referred to as a p-type impurity element) is added to the amorphous silicon film 102 through the mask insulating film. As the p-type impurity element, representatively an element belonging to the group 13, typically boron or gallium can be used. This step (called a channel doping step) is a step for controlling the threshold voltage of a TFT. Note that, here, boron is added by an ion doping method in which diborane ($B_2H_6$) is plasma excited without performing mass separation. Of course, an ion implantation method in which mass separation is performed may be used.

Next, a crystallization treatment of the amorphous silicon film 102 is carried out. First, a nickel acetate salt solution containing nickel of 10 ppm in terms of weight is applied onto the surface of the amorphous silicon film 102 to form a catalytic element containing layer 103 (FIG. 6A). A well-known method such as coating by a spinner or a sputtering method may be used as the coating method. Subsequently, as shown by the solid line graph of FIG. 4B, a light source is controlled to perform pulsed irradiation for heating (hereinafter, a light irradiated in a pulsed manner by controlling a light source is referred to as a pulsed light), an operation in which 1220° C. (measured by the temperature sensor indicated by 508b of FIG. 3) is held for 40 seconds and the pulsed light is cut for 5 seconds is made one cycle, and this is repeated three times, and at the fourth pulse, 1220° C. (measured by the temperature sensor indicated by 508b of FIG. 3) is held for 60 seconds. Note that, a time period in which the pulsed light 104 holds the highest intensity is about 1 to 5 seconds. In Embodiment 1, although the pulsed light 104 is irradiated four times, the irradiation may be performed 2 to 10 times. By this, a crystalline silicon film 105 is formed. Note that, in order to further raise the crystallization rate and to repair defects in crystal grains, laser irradiation may be performed on the crystalline silicon film 105 (FIG. 6B).

Besides, before the crystallization treatment, a heat treatment for reducing the hydrogen content of the amorphous silicon film may be carried out.

Subsequently, in order to getter the catalytic element used for the crystallization treatment from the crystalline silicon film 105, an impurity element (typically phosphorus) belonging to the group 15 of the periodic table and having the gettering function is added to form a gettering region 107. A mask insulating film 170 is formed and phosphorus is added to a region where the crystalline silicon film is exposed. Not only phosphorus but also boron may be added into the gettering region 107. Thereafter, a pulsed light 106 is irradiated. As the irradiated pulsed light, a pulsed light is suitable in which heating is performed at a rate of 100 to 200° C./second up to 1220° C., and the temperature is held for 40 seconds and is reduced at a rate of 50 to 150° C./sec down to 300 to 400° C. Besides, in order to prevent the glass substrate from being heated to the glass transition temperature or higher, the nitrogen gas of 2 to 10 (slm) as the refrigerant is made to flow in. By irradiating such a pulsed light once, the catalytic element is gettered by the gettering region 107. In order to obtain a sufficient gettering effect, the pulsed light irradiation may be carried out 2 to 20 times. Besides, it is preferable that the step of the heating treatment for crystallization of the semiconductor film and for gettering of the catalytic element is carried out in a reduced pressure atmosphere in which an oxygen concentration is reduced by the exhaust performed by a rotary pump and a mechanical booster pump (FIG. 6C).

Figure 7A:
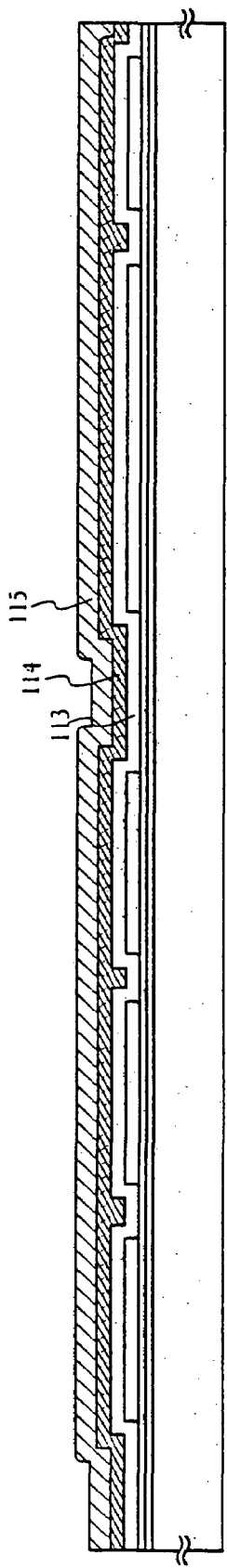
FIGS. 7A to 7C are views showing fabricating steps of the TFTs of Embodiment 1.

The excellent crystalline silicon film 105 obtained in this way is patterned into island shape to form semiconductor layers 108 to 112 which subsequently become active layers of TFTs (FIG. 6D). Next, a gate insulating film 113 having a thickness of 50 to 150 nm is formed by a plasma CVD method on the island-like semiconductor layers 108 to 112. Next, as a conductive film for formation of gate electrodes, a conductive film (A) 114 having a thickness of 20 to 100 nm and a conductive film (B) 115 having a thickness of 100 to 400 nm are formed. In Embodiment 1, although the conductive film (A) 114 is formed of TaN, and the conductive film (B) 115 is formed of W, the film may be formed of an element selected from Ta, W, Ti, Mo, Al and Cu, or an alloy material or a compound material containing the element as its main ingredient (FIG. 7A).

Next, masks 116a to 116g made of resist are formed, and the conductive film (A) 114 and the conductive film (B) 115 are etched, so that gate electrodes 117 to 120 made of the laminate of the conductive film (A) and the conductive film (B) are formed. Although the etching method is not limited, it is appropriate that an ICP (inductively coupled plasma) etching method is used. $CF_4$ and $Cl_2$ are used as the etching gas. A capacitance wiring line 121 which becomes an upper electrode of a storage capacitor, and wiring lines 122 and 123 are formed in the same step.

Figure 7B:
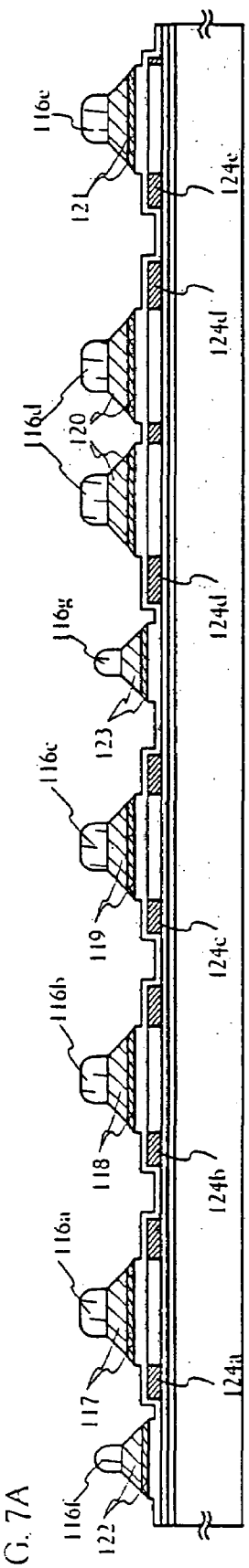

After the gate electrodes 117 to 120 and the wiring lines 121 to 123 are formed, an impurity element for imparting an n type (hereinafter referred to as an n-type impurity element) is added to the semiconductor layers 108 to 112 through the gate insulating film 113 by an ion doping method while using the gate electrodes as masks. By this step, n-type impurity regions 124a to 124e each having an impurity concentration of $1\times10^{16}$ to $1\times10^{18}$ atoms/cm$^3$ are formed (FIG. 7B).

Figure 7C:
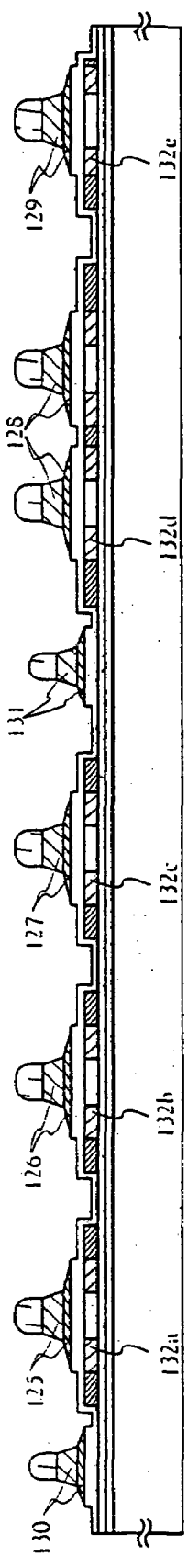

Next, a second etching treatment is carried out while the masks made of resist remain as they are, so that gate electrodes having second shapes and wiring lines 125 to 131 are formed. Subsequently, while the gate electrodes having the second shapes and the wiring lines 125 to 131 are used as masks, an n-type impurity element is further added. By this, n-type impurity regions (n+) each subsequently becoming a source region or a drain region and having an n-type impurity element concentration of $1\times10^{20}$ to $1\times10^{21}$ atoms/cm$^3$, and n-type impurity regions (n−) 132a to 132e each subsequently becoming a low concentration impurity region (hereinafter referred to as an LDD region) provided closer to a channel formation region than the n-type impurity region (n+) and having an n-type impurity element concentration of $1\times10^{18}$ to $1\times10^{19}$ atoms/m$^3$ are formed (FIG. 7C).

Figure 8A:
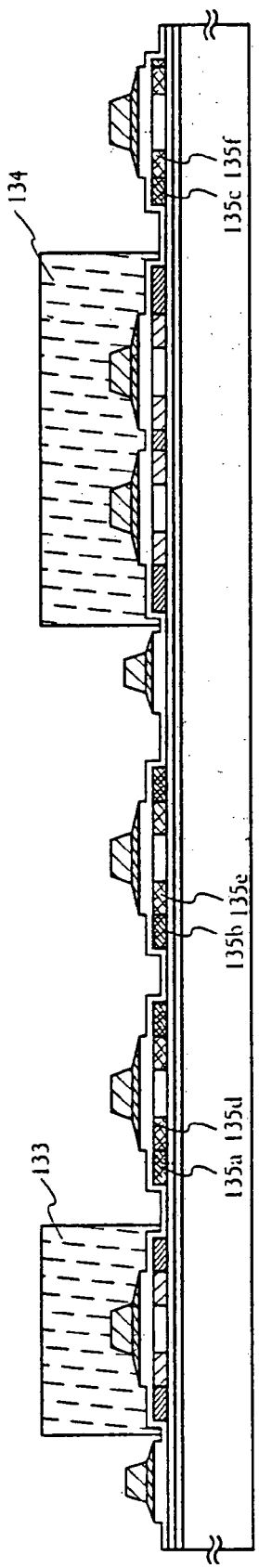
FIGS. 8A to 8C are views showing fabricating steps of the TFTs of Embodiment 1.
Figure 8B:
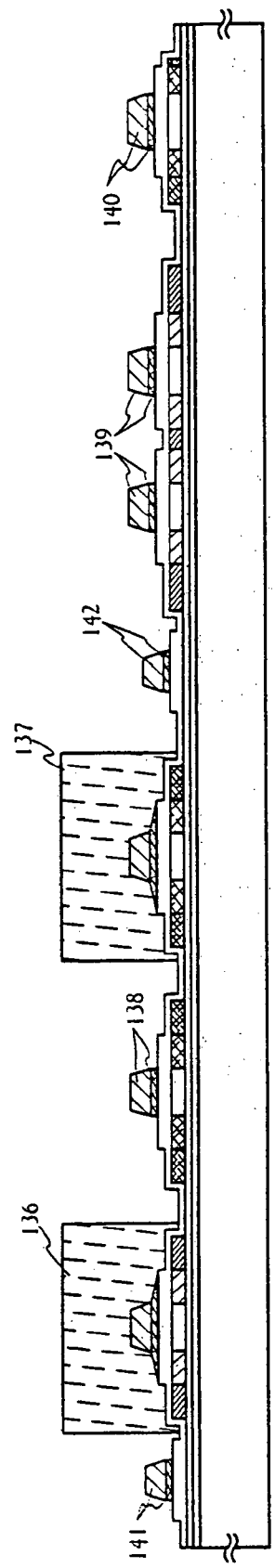

Then, masks 133 and 134 made of resist are formed in regions which become subsequent N-channel TFTs, and a p-type impurity element is added to form p-type impurity regions 135a and 135b. Note that, it is appropriate that the impurity concentration of the p-type impurity region 135 is made to become 1.5 to 3 times as high as the maximum value of the concentration of the n-type impurity avoided in the former step, that is, $2\times10^{20}$ to $2\times10^{21}$ atoms/cm$^3$ (FIG. 8A).

Next, an N-channel TFT 201 and a second P-channel TFT 203 of a subsequent driving circuit 206 are covered with masks 136 and 137 made of resist and an etching treatment is carried out, so that gate electrodes of third shapes and wiring lines 138 to 142 are formed in a first P-channel TFT 202 of the subsequent driving circuit 206, a pixel TFT 204 and wiring lines.

Next, a heating treatment for activating the impurity elements added to the semiconductor film is carried out. In this heating treatment, the PPTA apparatus shown in FIG. 3 is used, and the pulsed light is irradiated several times to carry out the activation. The pulsed light is irradiated from the rear surface side of the substrate (in the present specification, a surface on which a TFT is formed is made a substrate surface). By this heating treatment, the impurity elements can be certainly activated. Note, although in Embodiment 1 the pulsed laser light is irradiated from only the rear surface side of the substrate, the pulsed light can be irradiated from both of the front and rear sides of the substrate.

Figure 8C:
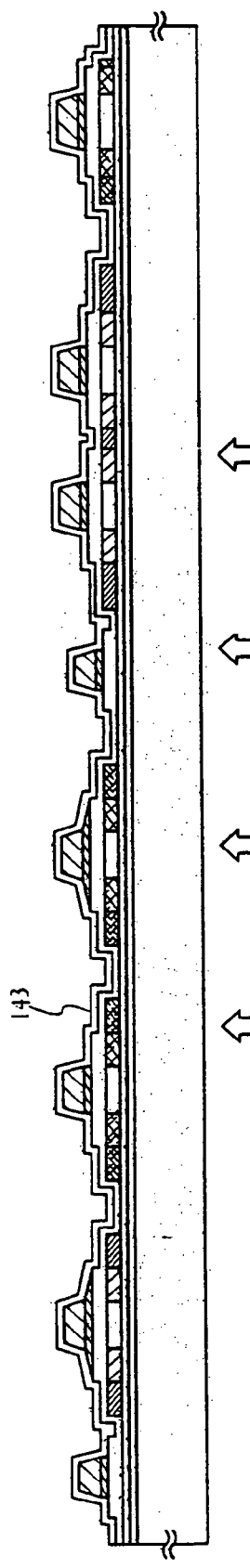
Figure 9:
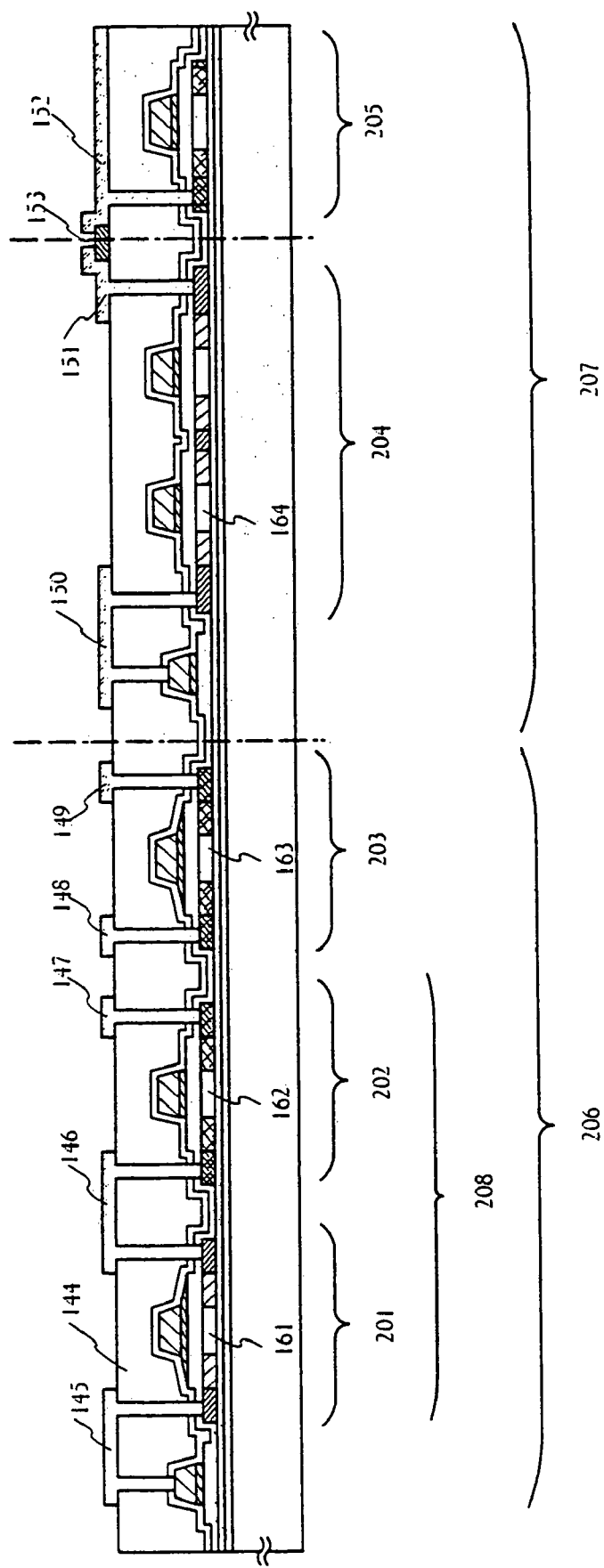
FIG. 9 is a view showing an active matrix substrate fabricated by using the present invention.

After the activation treatment, a first interlayer insulating film 143 made of a silicon nitride film or a silicon nitride oxide film is formed by a plasma CVD method. Then, a heating treatment for releasing hydrogen from the first interlayer insulating film 143 and hydrogenating the semiconductor film is carried out. This heating treatment may be carried out at 350 to 450° C. (preferably 410° C.) in a clean oven. Alternatively, a well-known hydrogenating treatment in an atmosphere containing hydrogen generated from formation of plasma may be carried out (FIG. 8C).

Next, as a second interlayer insulating film 144, an organic insulating material such as acrylic or polyimide is used to perform flattening. Then, contact holes reaching the semiconductor films 108 to 112 which become active layers of subsequent TFTs are formed in the first interlayer insulating film 143 and the second interlayer insulating film 144. A Ti film having a thickness of 100 to 200 nm, an alloy film (alloy film of Al and Ti) having a thickness of 250 to 350 nm, and a Ti film having a thickness of 50 to 150 nm are laminated thereon, and are patterned into desired shapes, so that connection wiring lines 145 to 152 are formed to electrically connect the respective TFTs.

Besides, in a pixel portion 207, a pixel electrode 153 is formed. The pixel electrode 153 is electrically connected to a drain region 124d of the pixel TFT 204 and a lower electrode (impurity doped semiconductor film) 135c of a storage capacitor 205.

An N-channel TFT 201 includes a channel formation region 161, the source region and drain region 124a, and the LDD region 132a in the active layer.

A first P-channel TFT 202 includes a channel formation region 162, the source region and drain region 135 in the active layer.

A second P-channel TFT 203 includes a channel formation region 163, the source region and drain region 135b, and the LDD region 135e in the active layer. Note that, the gate electrode 127 includes a region overlapping with the LDD region 135e.

A pixel TFT 204 includes a channel formation region 164, the source region and drain region 124d, and the LDD region 132d in the active layer. The storage capacitor 204 includes the lower electrode (semiconductor film doped with the impurity element) 112, a dielectric (an insulating film formed continuously from the gate insulating film 113) and an upper electrode (made of the laminate of the conductive film (A) and the conductive film (B) forming the gate electrodes) 129.

At this point, an active matrix substrate made of the driving circuit 206 including the CMOS structure 208 formed of the N-channel TFT 201 and the P-channel TFT 202, and the pixel portion 207 including the pixel TFT 204 and the storage capacitor 205 is fabricated.

When the present invention as described in Embodiment 1 is used, the heating treatment can be carried out by the PPTA apparatus in a short time, the throughput is improved, and the highly reliable TFT can be efficiently fabricated.

Embodiment 2

The crystallization step and the gettering step of the present invention can also be applied to a bottom gate type TFT substrate. A description thereof will be given with reference to FIGS. 10A to 10D and FIGS. 11A to 11C.

An insulating film (not shown) such as a silicon oxide film, a silicon-nitride film, or a silicon nitride oxide film is formed on a substrate 50, and a conductive film is formed to form a gate electrode, and is patterned into a desired shape to obtain a gate electrode 51. As the conductive film, an element selected from Ta, Ti, W, Mo, Cr and Al may be used, or a conductive film containing one of these elements as its main ingredient may be used (FIG. 10A).

Next, a gate insulating film 52 is formed. The gate insulating film may be a single layer of a silicon oxide film, a silicon nitride film, or a silicon nitride oxide film, or may have a laminate structure of some films.

Next, as an amorphous semiconductor film, an amorphous silicon film 53 having a thickness of 10 to 1150 nm is formed by a thermal CVD method, a plasma CVD method, a reduced pressure CVD method, an evaporation method, or a sputtering method. Note that, since the gate insulating film 52 and the amorphous silicon film 53 can be formed by the, same film growth method, both may be continuously formed. The continuous formation prevents the films from being once exposed to the air, so that pollution of the surface can be prevented, and fluctuation of characteristics of a fabricated TFT and variation of threshold voltage can be reduced (FIG. 10B).

Next, a crystallization treatment of the amorphous silicon film is carried out. A catalytic element is added to the amorphous silicon film to form a catalytic element containing layer 54. Subsequently, a light source (pulsed light 55) controlled in a pulsed manner is used to irradiate the amorphous silicon film, so that a crystalline semiconductor film (crystalline silicon film) 56 is formed.

Subsequently, a gettering treatment of the catalytic element for moving the catalytic element from a region which becomes a semiconductor layer of a TFT is carried out. A mask 57 is formed on the crystalline semiconductor film 56, and an impurity element having a gettering function is added to a selected region of the semiconductor film to form a gettering region 58. As the impurity element to be added, it is appropriate that an impurity element belonging to the group 15 of the periodic table, or an impurity element belonging to the group 15 of the periodic table and an impurity element belonging to the group 13 of the periodic table, or an impurity element belonging to the group 15 of the periodic table, an impurity element belonging to the group 13 of the periodic table and an impurity element belonging to the group 18 of the periodic table may be added. Thereafter, a light source (pulsed light 59) controlled in the pulsed manner is used to move the catalytic element into the gettering region 58 (FIG 10D).

Figure 11A:
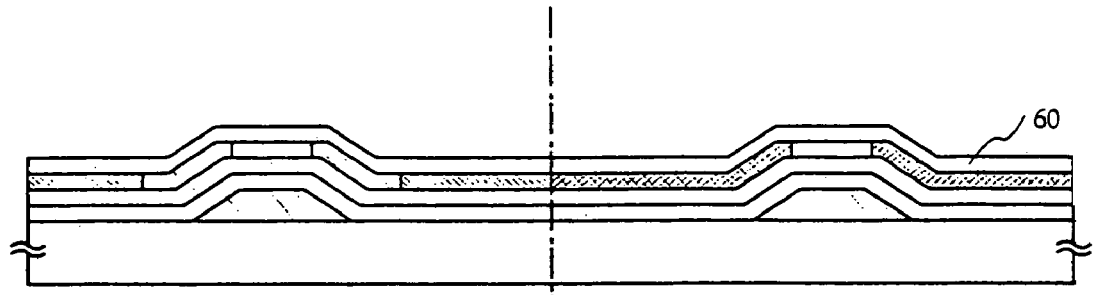
FIGS. 11A to 11C are views showing fabricating steps of TFTs of Embodiment 2.

Next, a protection insulating film 60 is formed to a thickness of 100 to 400 nm. Subsequently, a mask (not shown) made of resist is used to add an impurity element for imparting an n type to a crystalline silicon film which becomes an active layer of a subsequent N-channel TFT 70, and to add a p-type impurity element to a crystalline silicon film which becomes an active layer of a subsequent P-channel TFT 71, so that a source region, a drain region and an LDD region are formed (FIG. 11A).

Next, a treatment for activating the impurity element added to the crystalline silicon film is carried out. As the activation treatment, the heating treatment using the pulsed light disclosed in Embodiment Modes and Embodiment 1 may be used. Subsequently, after the activation treatment, a well-known hydrogenating treatment in an atmosphere containing hydrogen generated by formation of plasma may be carried out.

Figure 11B:
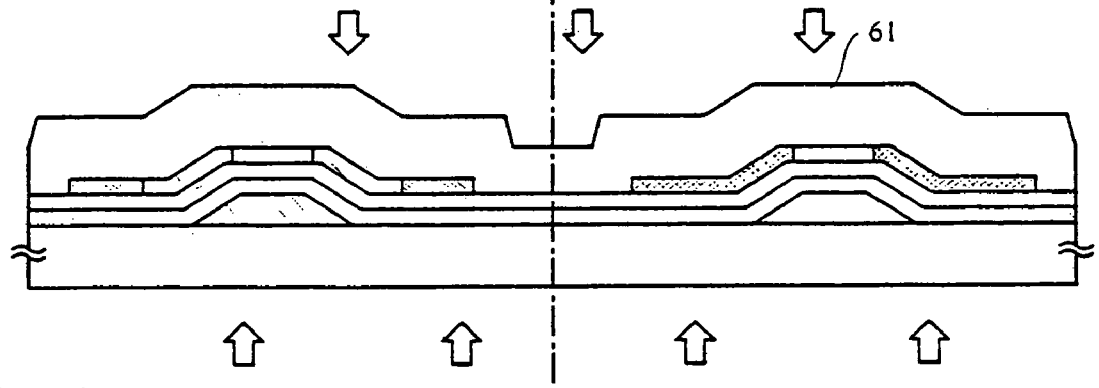

Next, the insulating film 60 on the crystalline silicon film is removed, and after the crystalline silicon film is formed into a semiconductor layer of a desired shape, an interlayer insulating film 61 is formed. The interlayer insulating film is formed of an insulating film containing silicon, such as a silicon oxide film, a silicon nitride film, or a silicon nitride oxide film, or a laminate of those to have a thickness of 500 to 1500 nm (FIG. 11B).

Figure 11C:
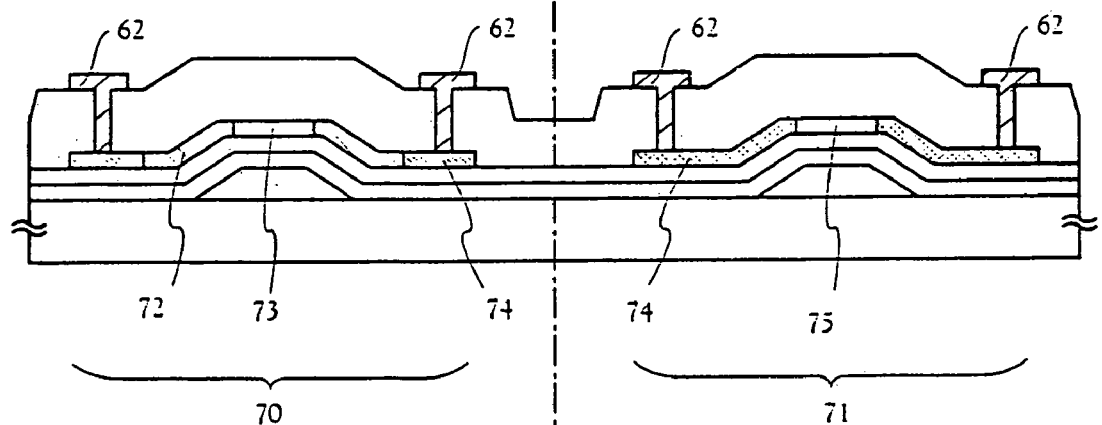

Thereafter, contact holes reaching source regions or drain regions 74 of respective TFTs are formed, and wiring lines 62 for electrically connecting the respective TFTs are formed (FIG. 11C). Note, reference numeral 72 indicates an LDD region; 73 and 75, channel formation regions.

As described above, the present invention can be applied irrespective of the shape of the TFT.

Embodiment 3

In the TFT fabricating process described in Embodiment 1, a crystallization step of an amorphous semiconductor film may be carried out as described below.

First, a nickel acetate salt solution containing nickel of 100 ppm in terms of weight is applied onto the surface of an amorphous silicon film 102, and a catalytic element containing layer 103 is formed. The coating method may be a well-known method such as coating by a spinner or a sputtering method. Subsequently, evacuation is performed by a rotary pump and a mechanical booster pump, and nitrogen of high purity (concentration of $CH_4$, $CO$, $CO_2$, $H$, $H_2O$ and $O_2$ contained in nitrogen is 1 ppb or less) is made to flow at 2 l/min to hold a pressure of 26.7 Pa, so that a nitrogen atmosphere is formed. In this nitrogen atmosphere, heating at 1220° C. for 60 seconds was performed only once. Note that, a time period in which the pulsed light holds the maximum intensity is about 1 to 5 seconds. By this, a crystalline silicon film 105 is formed. Note that, in order to further raise the crystallization ratio and to repair defects in crystal grains, laser irradiation may be carried out to the crystalline silicon film 105.

Besides, a heat treatment for reducing the hydrogen content of the amorphous silicon film may be carried out before the crystallization treatment.

Embodiment 4

Figure 12:
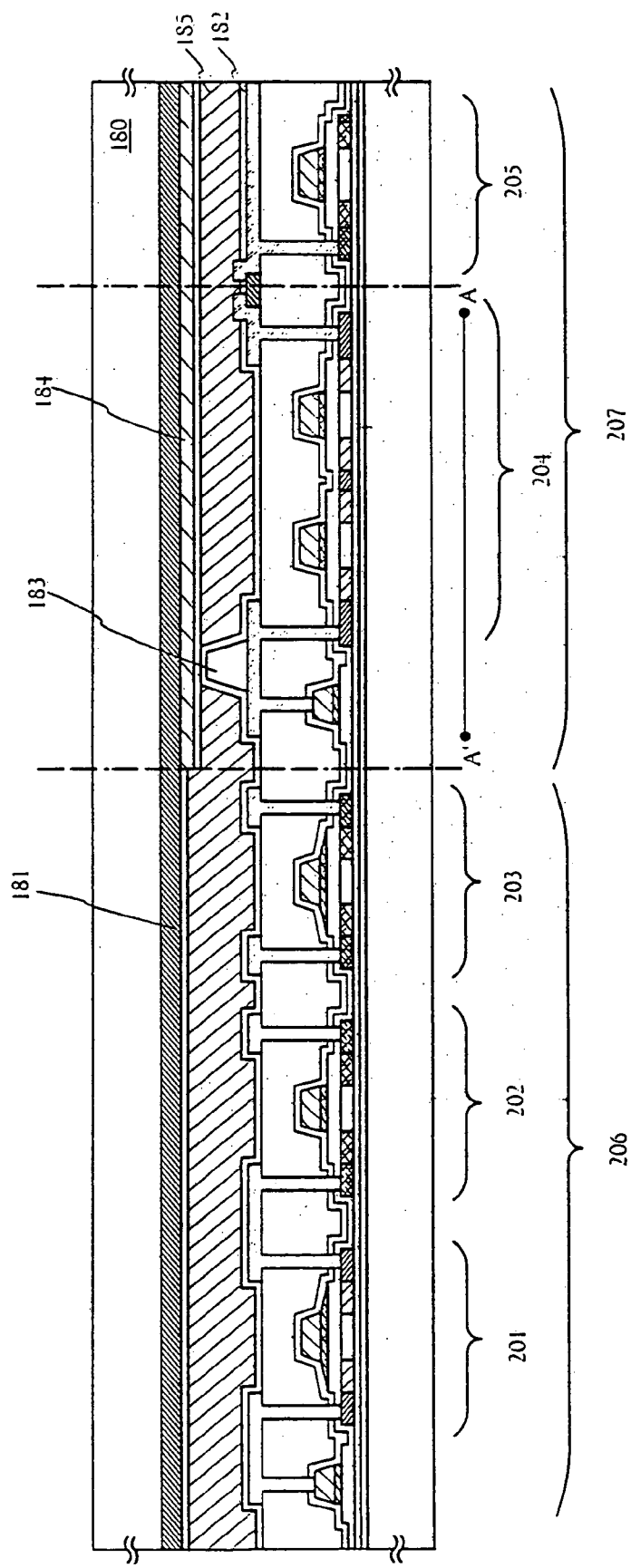
FIG. 12 is a view showing an active matrix type liquid crystal display device of Embodiment 4.

In Embodiment 4, a description will be given of a process of fabricating an active matrix driving liquid crystal display device from a TFT substrate fabricated by the application of Embodiments 1 to 3. FIG. 12 shows a state in which a TFT substrate is bonded to a counter substrate 180 by a sealing member. A columnar spacer 183 is formed on the TFT substrate. It is appropriate that the columnar spacer 183 is formed to conform with a cavity of a contact portion formed over a pixel electrode. The columnar spacer 183 is formed to have a height of 3 to 10 μm although depending on a liquid crystal material used. Since a recess portion corresponding to a contact hole is formed at the contact portion, the spacer is formed to conform with this portion so that disturbance of orientation of liquid crystal can be prevented. Thereafter, an orientation film 182 is formed and a rubbing treatment is carried out. A transparent conductive film 184, and an orientation film 181 are formed on the counter substrate 180. Thereafter, the TFT substrate is bonded to the counter substrate 180 by the sealing member, and liquid crystal is injected to form a liquid crystal layer 185. In the manner described above, the active matrix driving liquid crystal display device can be completed.

Embodiment 5

Another method of fabricating an active matrix-substrate by using the PPTA apparatus will be described with reference to FIGS. 17A to 18C. Note that, FIGS. 17A to 17E and FIGS. 18A to 18C illustrate a method of forming a pixel TFT 320 and a storage capacitor 321 of a pixel portion.

An underlying insulating film 301 is formed on a surface on a substrate 300. As the underlying insulating film 301, a silicon oxide film, a silicon nitride film, or a silicon nitride oxide film, or a laminate structure of some films may be used. In Embodiment 5, a silicon nitride oxide film having a thickness of 50 to 200 nm is formed by a plasma CVD method using $SiH_4$ and $N_2O$.

Figure 17A:
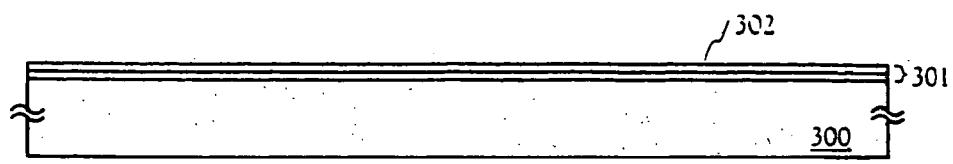
FIGS. 17A to 17E are views showing fabricating steps of TFTs of Embodiment 5.

Next, a considerably thin film (hereinafter referred to as a thin film for convenience) 302 of Ni is formed. The substrate 300 on which the underlying insulating film 301 is formed is put in a film growth chamber of a parallel flat plate type plasma CVD apparatus using an electrode made of a material containing Ni or a positive column type plasma CVD apparatus, and plasma is generated in an atmosphere of nitrogen, hydrogen, or inert gas. In Embodiment 5, by a plasma treatment under the conditions of substrate temperature of 300° C., pressure of 6.65 Pa, argon of 100 (sccm), and RF electric power of 50 W, the Ni thin film 302 of a Ni amount of $1\times10^{10}$ $atoms/cm^2$ to $1\times10^{13}$ $atoms/cm^2$ is formed. The Ni thin film 302 functions as the catalytic element for facilitating crystallization in a subsequent step of crystallizing a semiconductor layer (FIG. 17A). Note that, in Embodiment 5, although the Ni thin film is formed, as long as an element (called a catalytic element in the present specification) has a function of facilitating crystallization of a semiconductor film, in addition to nickel (Ni), a thin film containing one kind or plural kinds of elements selected from Fe, Co, Ru, Rh, Pd, Os, Ir, Pt, Cu, and Au may be formed.

Figure 17B:
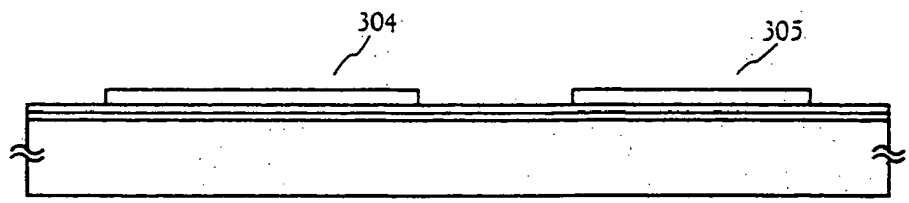

Next, an amorphous silicon film is formed on the Ni thin film 302. The film is patterned into a desired shape to form a semiconductor layer 304 which becomes an active layer of a subsequent TFT, and a semiconductor layer 305 which becomes a lower electrode of a subsequent storage capacitor (FIG. 17B).

Figure 17C:
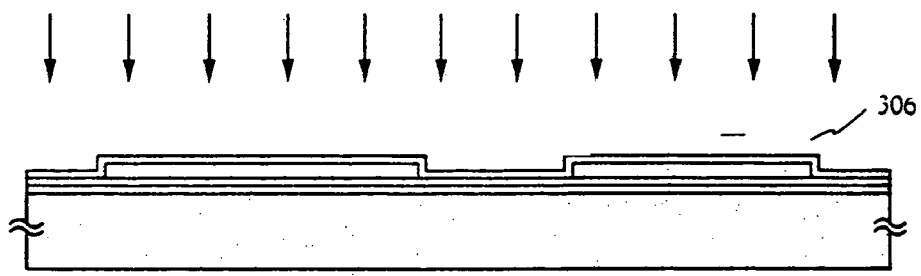

Subsequently, a mask insulating film 306 is formed on the semiconductor layers 304 and 305. As the mask insulating film, a silicon oxide film is formed by a plasma CVD method. Thereafter, a p-type impurity element (typically boron or gallium) is added to the semiconductor layer through the mask insulating film 306. This step (called a channel doping step) is carried out to control the threshold voltage of a TFT. By this step, the p-type impurity element (in Embodiment 5, boron) at a concentration of $1\times10^{15}$ to $1\times10^{16}$ $atoms/cm^3$ is added to the semiconductor layer (FIG. 17C).

Figure 17D:
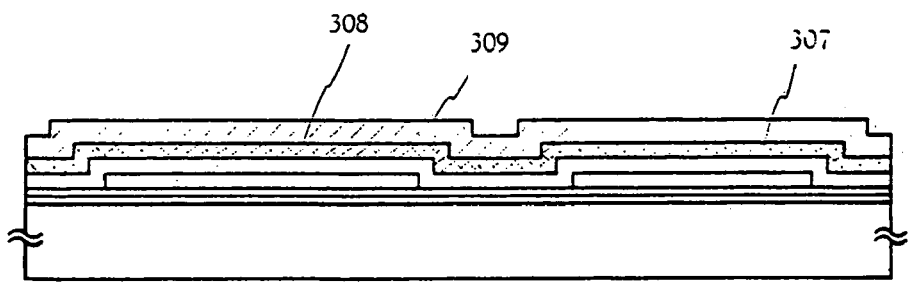

Next, the mask insulating film 306 is removed, and a gate insulating film 307 is formed (FIG. 17D). The gate insulating film is formed by using a plasma CVD method or a sputtering method. Subsequently, in order to form a gate electrode, a conductive film (A) 308 and a conductive film (B) 309 are formed. In Embodiment 5, the conductive film (A) is made of tantalum nitride (TaN), and this film is formed to a thickness of 50 to 100 nm. The conductive film (B) is formed to a thickness of 100 to 300 nm by using a high melting metal such as tungsten (W) or molybdenum (Mo). The conductive film (A) and the conductive film (B) are etched to form a gate electrode 310 and a capacitance wiring line 311 which becomes an upper electrode of a subsequent storage capacitor. Although the etching method is not limited, the ICP (inductively coupled plasma) etching method is preferably used. At this time, a mixture gas of $CF_4$ and $Cl_2$ is used as the etching gas.

Figure 17E:
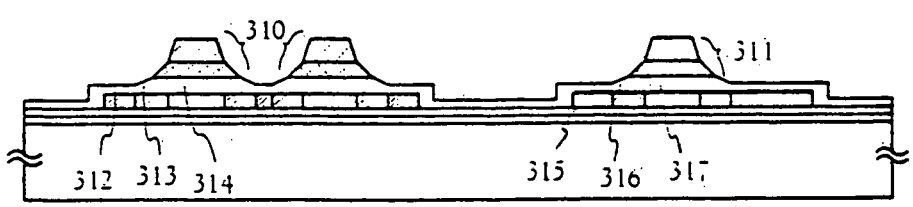

An n-type impurity element is added to the semiconductor layer while the gate electrode and the capacitance wiring line are used as masks, so that an n-type impurity region 312 which contains the n-type impurity element at a concentration of $1\times10^{20}$ to $1\times10^{21}$ $atoms/cm^3$ and becomes a source region or a drain region of an active layer of a subsequent TFT, an n-type impurity region 313 which contains the n-type impurity element at a concentration of $1\times10^{15}$ to $1\times10^{19}$ $atoms/cm^3$ and becomes an LDD region of the active layer of the subsequent TFT, and a channel formation region 314 are formed (FIG. 17E).

Next, a region which becomes a subsequent N-channel TFT is covered with a mask, and a p-type impurity element is added to a region which becomes a subsequent P-channel TFT (not shown). Note that, in this step, the p-type impurity region doped with the p-type impurity element at a concentration of $2\times10^{20}$ to $2\times10^{21}$ $atoms/cm^3$ is formed (not shown). Note, reference numerals 315 and 316 indicate impurity regions formed in the semiconductor layer 305 of the lower electrode of the storage capacitor 321. Reference numeral 317 denotes a region not added with the impurity elements.

Figure 18A:
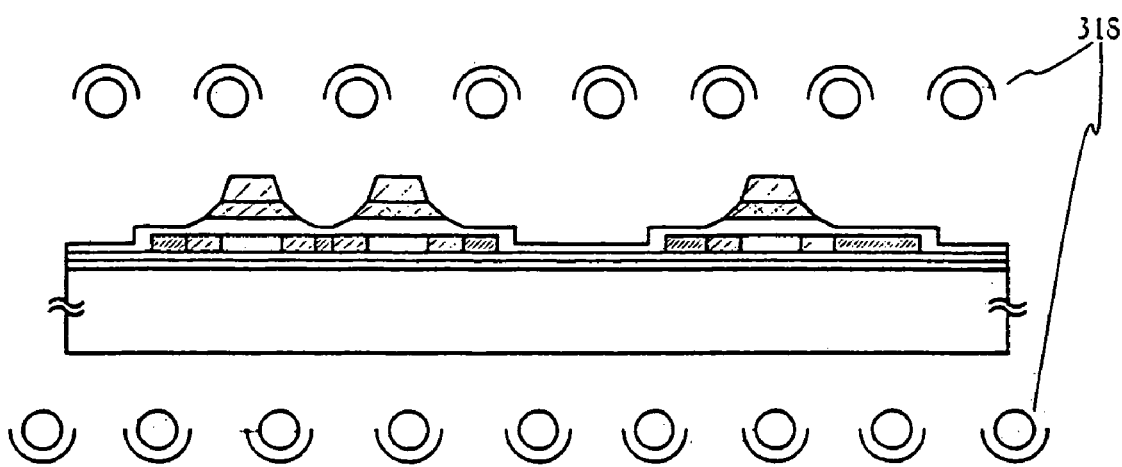
FIGS. 18A to 18C are views showing fabricating steps of TFTs of Embodiment 5.

Subsequently, while cooling with a refrigerant is performed by the PPTA apparatus, a step of crystallizing the semiconductor layer in the amorphous state is carried out. A light source 313 is controlled in a pulsed manner to irradiate the substrate. The light source is controlled so that the temperature becomes 800 to 1100° C. when measured by a thermocouple (508b of FIG. 3) embedded in a silicon wafer, this temperature is held for 1 to 30 seconds, and such irradiation is preferably performed 1 to 5 times. Since the gate insulating film 307 and the gate electrodes 310 and 311 are formed on the semiconductor layer, heat becomes hard to dissipate from the semiconductor layer, and the semiconductor layer can be efficiently crystallized in a short time. Note that, in this step, it is preferable that exhaustion is performed by a rotary pump and a mechanical booster pump to reduce an oxygen concentration in an atmosphere, and the heating treatment is carried out in the atmosphere which contains nitrogen or inert gas and has a reduced pressure of about 0.001 to 26.7 Pa in the treatment chamber (FIG. 18A).

Figure 18B:
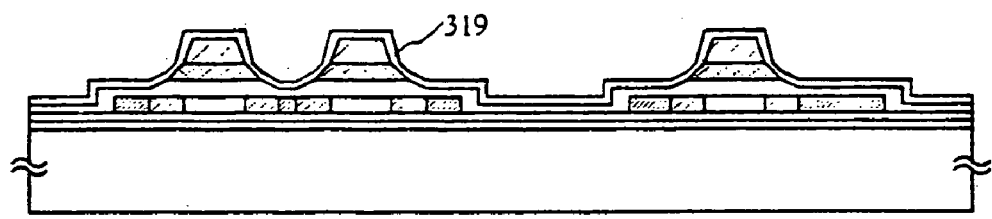
Figure 18C:
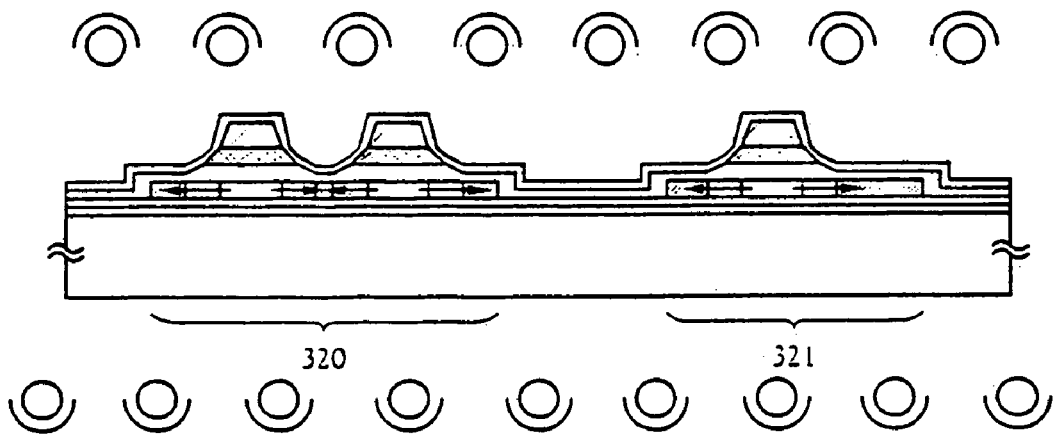

Next, a first interlayer insulating film 319 is formed on the gate electrode. As the first interlayer insulating film, it is appropriate that an insulating film containing silicon, such as a silicon nitride film, a silicon oxide film, or a silicon nitride oxide film, or a laminate film of a combination of those is formed to a thickness of about 100 to 400 nm (FIG. 18B).

Subsequently, the PPTA apparatus is used and the light source controlled in the pulsed manner performs irradiation several times, so that the impurity elements added to the semiconductor layer are activated. In this step, the Ni element which functions as the catalytic element at the time of crystallization and subsequently diffuses in the semiconductor layer is moved (arrows of FIG. 18C) toward the region 312 where the impurity element (phosphorus) having the gettering function is added at a high concentration, so that the concentration of the catalytic element (Ni) of a region which becomes the channel formation region 314 of the subsequent active layer can be reduced to a concentration of $1 \times 10^{17}$ atoms/cm$^3$ or less (preferably $1 \times 10^{16}$ atoms/cm$^3$ or less). Besides, in this step, it is preferable that exhaustion is performed by a rotary pump and a mechanical booster pump to reduce an oxygen content in an atmosphere and the heating treatment is carried out in the reduced pressure atmosphere.

Hereinafter, if fabrication is performed in accordance with the steps subsequent to the hydrogenating treatment of Embodiment 1, the semiconductor device can be efficiently fabricated in a short time without using an electric furnace.

Embodiment 6

Another method of fabricating an active matrix type substrate having a pixel TFT 410 and a storage capacitor 411 thereon using the PPTA apparatus will be described with reference to FIGS. 19A to 19D.

In Embodiment 6, steps up to a step of forming a conductive film (A) 308 and a conductive film (B) 309 may be carried out in accordance with Embodiment 5. Note that, the same reference characters are used in the same steps.

Figure 19A:
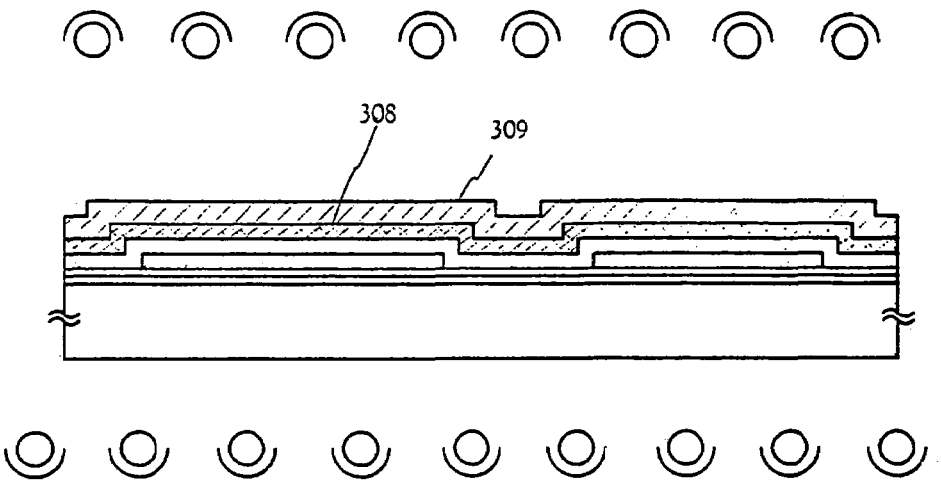
FIGS. 19A to 19D are views showing fabricating steps of TFTs of Embodiment 6.

After the conductive film (A) 308 and the conductive film (B) 309 are formed, crystallization of a semiconductor layer in an amorphous state is carried out in the PPTA apparatus by cooling with a refrigerant and by irradiation from a light source controlled in a pulsed manner (FIG. 19A). The light source is controlled so that a temperature of 800 to 1100° C. measured by a thermocouple (508b of FIG. 3) embedded in a silicon wafer is held for 1 to 30 seconds, and this irradiation is repeated 1 to 5 times.

As described in Embodiment 6, when crystallization is carried out in a state where a gate insulating film and a gate electrode are formed on the semiconductor layer, heat becomes hard to dissipate, and crystallization of the semiconductor layer can be more efficiently carried out in a short time. Note that, in this step, it is preferable that exhaustion is performed by a rotary pump and a mechanical booster pump to reduce an oxygen content in an atmosphere and the heating treatment is carried out in the reduced pressure atmosphere.

Next, the conductive film (A) 308 and the conductive film (B) 309 are patterned into desired shapes to form a gate electrode 401 and a capacitance wiring line 402 which becomes an upper electrode of a subsequent storage capacitor. Although a method of forming the gate electrode and the storage capacitor is not limited, similarly to Embodiment 1, it is appropriate that the IPC etching method is used.

Figure 19B:
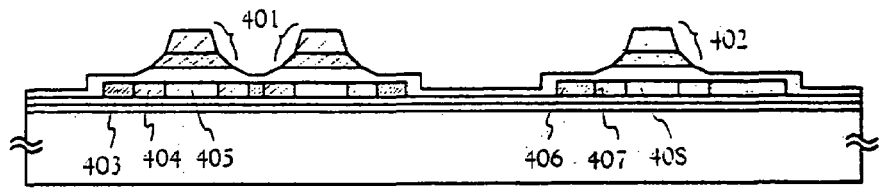
Figure 19C:
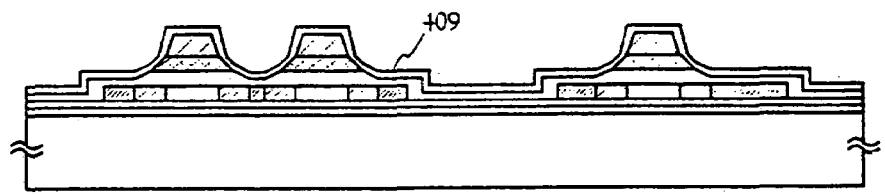

An n-type impurity element and a p-type impurity element are added in accordance with the step of Embodiment 5 to form impurity regions 403, 404, 406 and 407, and regions 405 and 408 not added with the impurity elements (FIG. 19B). Subsequently, a first interlayer insulating film 409 is formed by forming an insulating film containing silicon, such as a silicon nitride film, a silicon oxide film, or a silicon nitride oxide film, or a laminate film of a combination of those to have a thickness of about 100 to 400 nm (FIG. 19C).

Figure 19D:
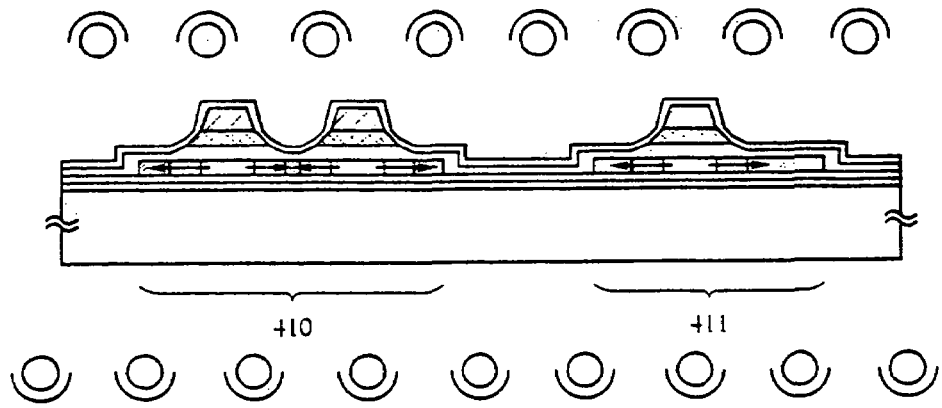
Figure 20:
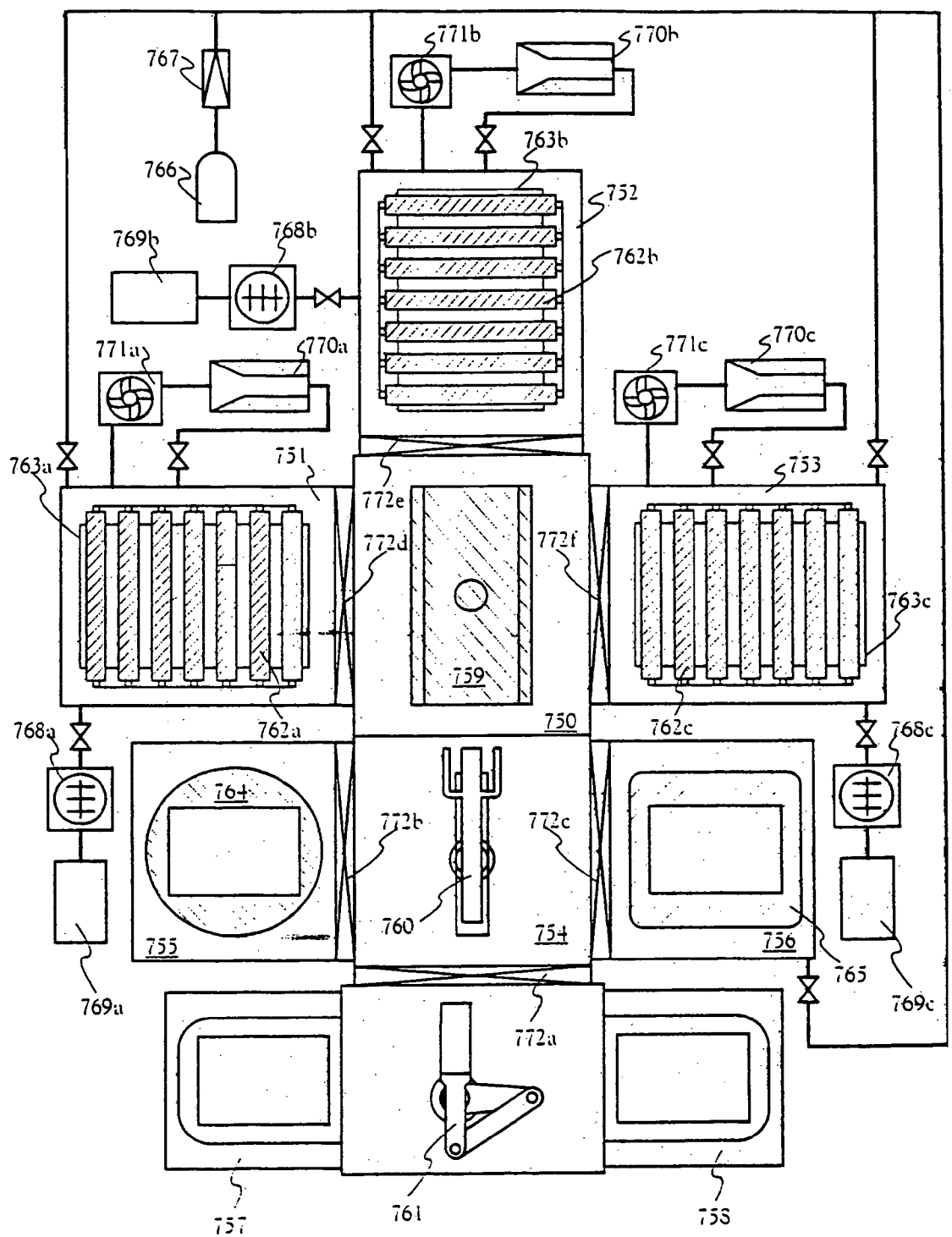
FIG. 20 is a view showing an example of a heating treatment apparatus used in the present invention.

Next, a heating treatment for activating the impurity elements by the PPTA apparatus is carried out. In the step of the heating treatment for activation, the catalytic element in the semiconductor layer can be gettered by the region 403 doped with phosphorus at a high concentration (FIG. 19D).

In accordance with Embodiment 6, a semiconductor device including a semiconductor layer with excellent crystallinity can be efficiently fabricated without using an electric furnace. Embodiment 6 is combined with Embodiment 3 so that the active matrix type liquid crystal display device can be completed.

Embodiment 7

In Embodiment 7, a process of fabricating an active matrix driving light-emitting device using a TFT substrate (active matrix substrate) obtained according to Embodiment 1 will be described with reference to FIG. 16.

A glass substrate is used as a substrate 1601. On the glass substrate 1601, an N-channel TFT 1652 and a P-channel TFT 1653 are formed in a driving circuit 1650, and a switching TFT 1654 and a current controlling TFT 1655 are formed in a pixel portion 1651. These TFTs are formed by using semiconductor layers 1603 to 1606, a second insulating film 1607 as a gate insulating film, gate electrodes 1608 to 1611, and the like.

A first insulating film 1602 formed on the substrate 1601 is provided by forming a silicon nitride oxide (expressed by $SiO_xN_y$) film, a silicon nitride film or the like to have a thickness of 50 to 200 nm. An interlayer insulating film is made of an inorganic insulating film 1618 formed of silicon nitride, silicon nitride oxide or the like and an organic insulating film 1619 formed of acrylic, polyimide or the like.

Although a circuit structure of the driving circuit 1650 is different between a gate signal side driving circuit and a data signal side driving circuit, the explanation thereof is omitted here. Wiring lines 1612 and 1613 are connected to the N-channel TFT 1652 and the P-channel TFT 1653, and a shift register, a latch circuit, a buffer circuit and the like are formed by using these TFTs.

In the pixel portion 1651, a data wiring line 1614 is connected to a source side of the switching TFT 1654, and a wiring line 1615 at a drain side is connected to the gate electrode 1611 of the current controlling TFT 1655. Besides, a source side of the current controlling TFT 1655 is connected to a power supply line 1617, and an electrode 1616 at a drain side is connected to an anode of an EL element.

The EL element including an anode, a cathode, and a layer (hereinafter referred to as an EL layer) in which electroluminescence is obtained and which contains an organic compound is formed over the TFT of the pixel portion. Note that, luminescence of an organic compound includes light emission (fluorescence) obtained when a singlet excited state is returned to a ground state, and light emission (phosphorescence) obtained when a triplet excited state is returned to the ground state, and both are included.

The EL element is provided after banks 1620 and 1621 are formed using an organic resin such as acrylic or polyimide, preferably a photosensitive organic resin so as to cover the wiring line. In Embodiment 7, the element 1656 includes an anode 1622 formed of ITO (indium tin oxide), an EL layer 1623, and a cathode 1624 formed by using a material such as an alkaline metal or an alkaline-earth metal, for example, MgAg or LiF. The banks 1620 and 1621 are formed so as to cover an end of the anode 1622, and are provided to prevent the cathode and the anode from short-circuiting at this portion.

The cathode 1624 of the EL element is provided on the EL layer 1623. As the cathode 1624, a material including magnesium (Mg), lithium (Li) or calcium (Ca) having a low work function is used. Preferably, an electrode formed of MgAg (mixed material of Mg and Ag at a ratio of 10 to 1) may be used. In addition, a MgAgAl electrode, a LiAl electrode or a LiFAl electrode can be enumerated.

Although it is necessary that the laminate made of the EL layer 1623 and the cathode 1624 is separately formed for every pixel, since the EL layer is extremely weak against water, a normal photolithography technique can not be used. Besides, the cathode 1624 fabricated by using alkaline metal is easily oxidized. Accordingly, it is preferable that a physical mask member such as a metal mask is used to selectively form them by a vapor phase method such as a vacuum evaporation method, a sputtering method, or a plasma CVD method. Besides, a protection electrode for protection against outside moisture or the like may be stacked on the cathode 1624. It is preferable that a low resistance material including aluminum (Al), copper (Cu) or silver (Ag) is used for the protection electrode.

In order to obtain high brightness with low electric power consumption, an organic compound (hereinafter referred to as a triplet compound) emitting light by a triplet exciton (triplet) is used as the material forming the EL layer. Note that, a singlet compound indicates a compound emitting light through only singlet excitation, and the triplet compound indicates a compound emitting light through triplet excitation.

As the triplet compound, organic compounds disclosed in the following papers can be cited as typical materials. (1) T. Tsutsui. C. Adachi, S. Saito, Photochemical Processes in Organized Molecular Systems, ed. K. Honda, (Elsevier Sci. Pub., Tokyo, 1991) p. 437. (2) M. A. Baldo, D. F. O'Brien, Y. You, A. Shoustikov, S. Sibley, M. E. Thompson, S, R. Forrest, Nature 395 (1988) p. 151. (3) M. A. Baldo, S. Lamansky, P. E. Burrrows, M. E. Thompson, S. R. Forrest, Appl. Phys. Lett., 75 (1999) p. 4 (4) T. Tsutsui, M.-J. Yang, M. Yahiro, K. Nakamura, T. Watanabe, T. Tsuji, Y. Fukuda, T. Wakimoto, S. Mayaguchi, Jpn. Appl. Phys., 38 (12B) (1999) L1502.

The triplet compound has higher light emission efficiency than the singlet compound, and an operation voltage (voltage required to cause an EL element to emit light) can be lowered to obtain the same luminous brightness.

Figure 16:
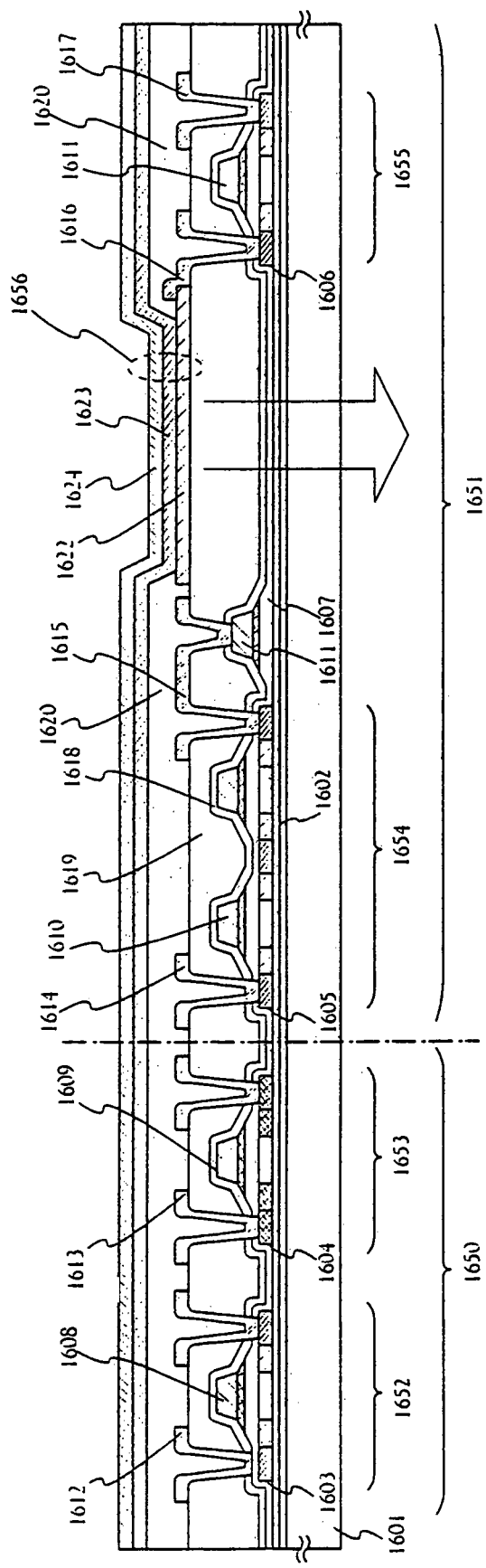
FIG. 16 is a view showing a light-emitting device of Embodiment 7.

In FIG. 16, the switching TFT 1654 is made to have a multi-gate structure, and the current controlling TFT 1655 is provided with an LDD overlapping with the gate electrode. A TFT using polycrystalline silicon has a high operation speed, so that deterioration of hot carrier injection or the like is apt to occur. Thus, as shown in FIG. 16, to form the TFTs (the switching TFT having a sufficiently low off current and the current controlling TFT resistant to the hot carrier injection) having different structures according to the functions in a pixel is very effective in fabrication of a display device which has high reliability and enables excellent image display (high operation performance). In the manner described above, an active matrix driving light emitting device can be completed.

Embodiment 8

The CMOS circuit and the pixel portion formed by implementing the present invention can be used in active matrix type liquid crystal display. That is, the present invention can be implemented in all of electronic apparatus integrated with the liquid crystal display device at display portions thereof.

As such electronic apparatus, there are pointed out a video camera, a digital camera, a projector (rear type or front type), a head mount display (goggle type display), a personal computer, a portable information terminal (mobile computer, portable telephone or electronic book) and the like. Examples of these are shown in FIGS. 13A-13F, 14A-14D and 15A-15C.

FIG. 13A shows a personal computer including a main body 2001, an image input portion 2002, a display portion 2003 and a keyboard 2004.

FIG. 13B shows a video camera including a main body 2101, a display portion 2102, a voice input portion 2103, operation switches 2104, a battery 2105 and an image receiving portion 2106.

FIG. 13C shows a mobile computer including a main body 2201, a camera portion 2202, an image receiving portion 2203, an operation switch 2204 and a display portion 2205.

FIG. 13D shows a goggle type display including a main body 2301, a display portion 2302 and an arm portion 2303.

FIG. 13E shows a player using a record medium recorded with programs (hereinafter, referred to as record medium) including a main body 2401, a display portion 2402, a speaker portion 2403, a record medium 2404 and an operation switch 2405. The player uses DVD (digital Versatile Disc) or CD as the record medium and can enjoy music, enjoy movie and carry out game or Internet.

FIG. 13F shows a digital camera including a main body 2501, a display portion 2502, an eye contact portion 2503, operation switches 2504 and an image receiving portion (not illustrated).

Figure 14A:
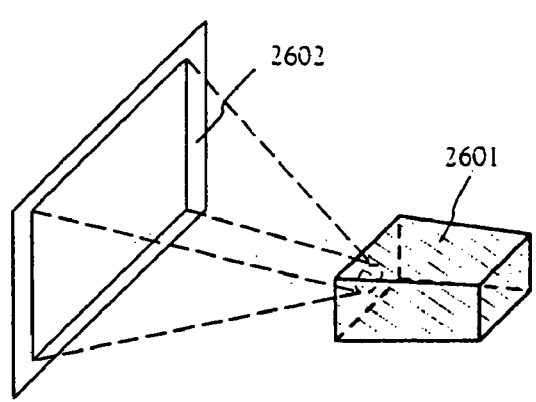
FIGS. 14A to 14D are views showing examples of electronic instruments of Embodiment 8.

FIG. 14A shows a front type projector including a projection apparatus 2601 and a screen 2602.

Figure 14B:
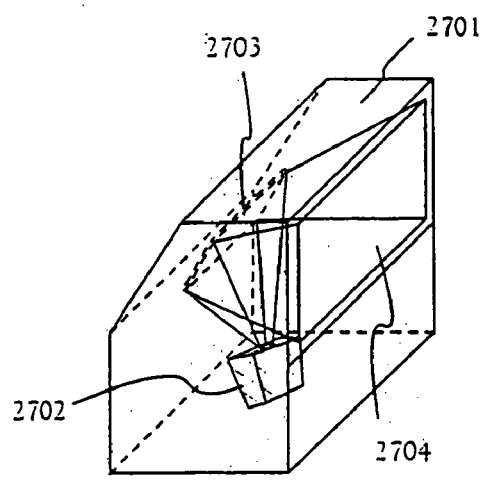

FIG. 14B shows a rear type projector including a main body 2701, a projection apparatus 2702, a mirror 2703 and a screen 2704.

Figure 14C:
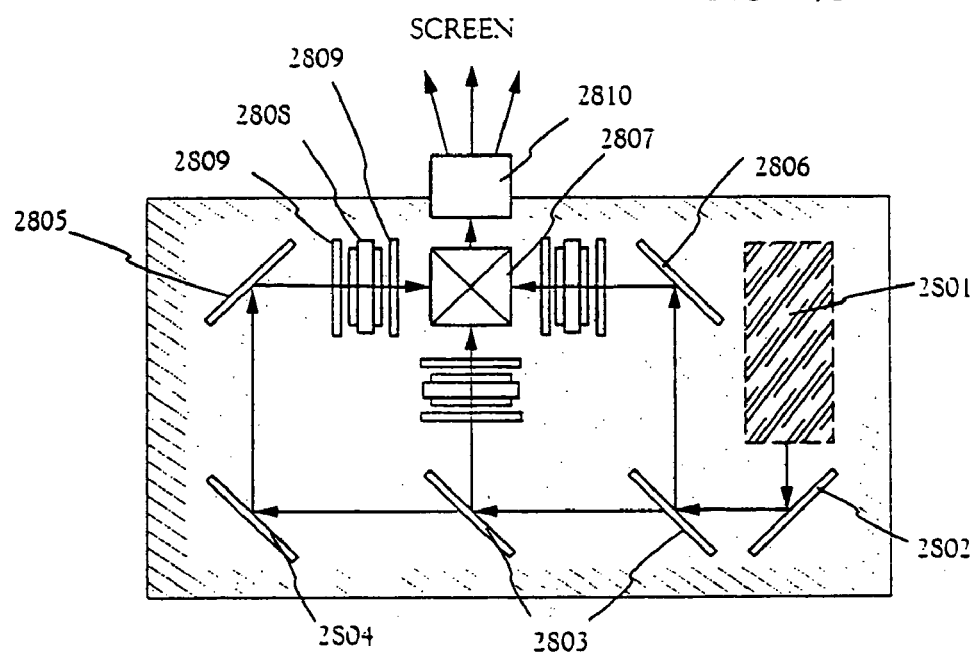

Further, FIG. 14C is a view showing an example of a structure of the projection apparatus 2601 and 2702 in FIG. 14A and FIG. 14B. The projection apparatus 2601 or 2702 is constituted by a light source optical system 2801, mirrors 2802, 2804-2806, a dichroic mirror 2803, a prism 2807, a liquid crystal display apparatus 2808, a phase difference plate 2809 and a projection optical system 2810. The projection optical system 2810 is constituted by an optical system including a projection lens. Although the embodiment shows an example of three plates type, the embodiment is not particularly limited thereto but may be of, for example, a single plate type. Further, person of executing the embodiment may pertinently provide an optical system such as an optical lens, a film having a polarization function, a film for adjusting a phase difference or an IR film in an optical path shown by arrow marks in FIG. 14C.

Figure 14D:
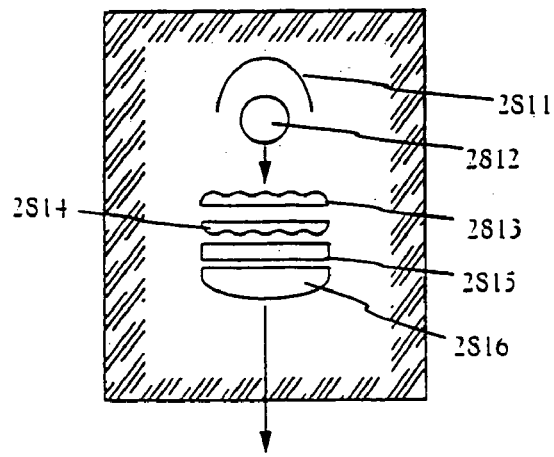

Further, FIG. 14D is a view showing an example of a structure of the light source optical system 2801 in FIG. 14C. According to the embodiment, the light source optical system 2801 is constituted by a reflector 2811, a light source 2812, lens arrays 2813 and 2814, a polarization conversion element 2815 and a focusing lens 2816. Further, the light source optical system shown in FIG. 14D is only an example and the embodiment is not particularly limited thereto. For example, a person of executing the embodiment may pertinently provide an optical system such as an optical lens, a film having a polarization function, a film for adjusting a phase difference or an IR film in the light source optical system.

However, according to the projectors shown in FIG. 14, there is shown a case of using a transmission type liquid crystal display device and an example of applying a reflection type liquid crystal display device is not illustrated.

Figure 15A:
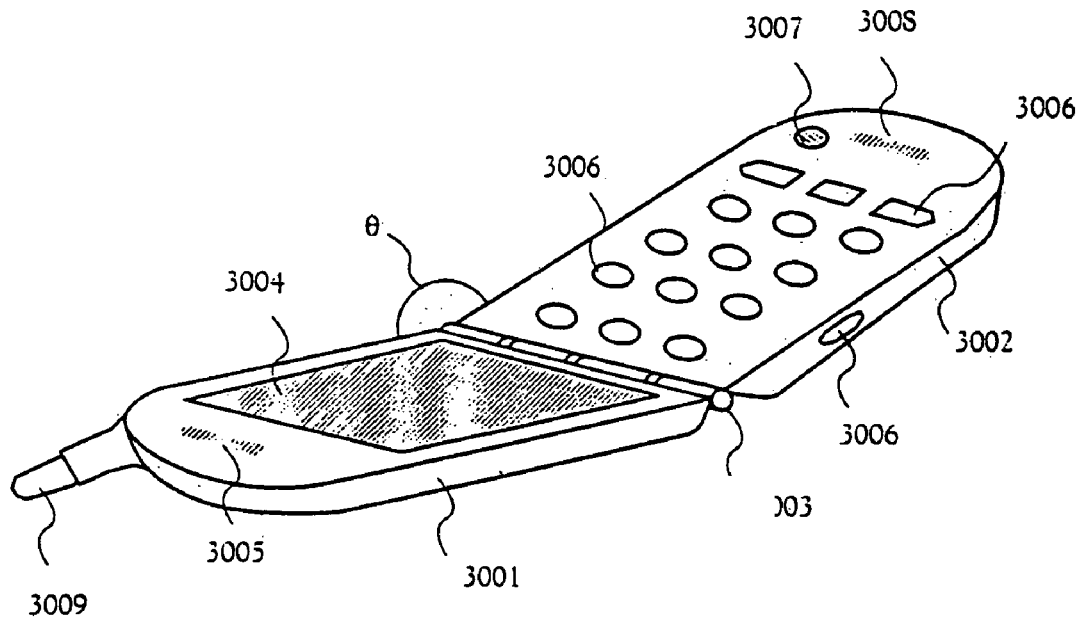
FIGS. 15A to 15C are views showing examples of electronic instruments of Embodiment 8.

FIG. 15A shows a portable telephone including a display panel 3001, an operation panel 3002. The display panel 3001 and the operation panel 3002 is connected to each other in the connecting portion 3003. In the connecting panel 3003, the angle θ of a face which is provided the display portion 3004 of the display panel 3001 and a face which is provided the operation key 3006 of the operation panel 3002 can be changed arbitrary. Further, a voice output portion 3005, an operation key 3006, a power source switch 3007 and a sound input portion 3008 are also included.

Figure 15B:
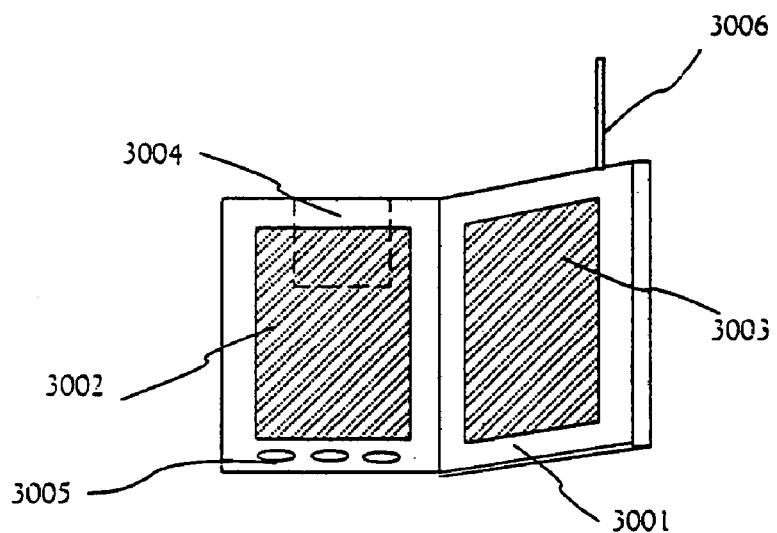

FIG. 15B shows a portable book (electronic book) including a main body 3001, display portions 3002 and 3003, a record medium 3004, an operation switch 3005 and an antenna 3006.

Figure 15C:
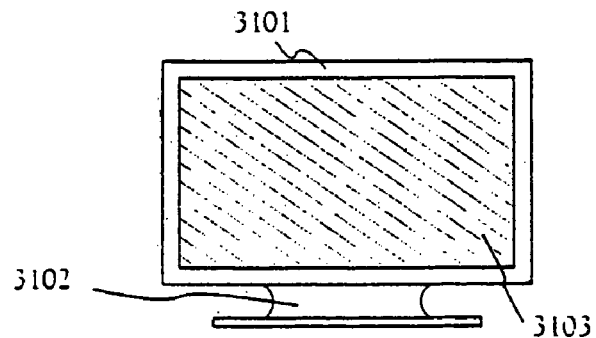

FIG. 15C shows a display including a main body 3101, a support base 3102 and a display portion 3103. The display according to the invention is advantageous particularly in the case of large screen formation and is advantageous in the display having a diagonal length of 10 inch or more (particularly, 30 inch or more).

As has been described, the range of applying the invention is extremely wide and is applicable to electronic apparatus of all the fields. The electronic apparatus of the present invention can be implemented by freely combined with Embodiment Modes and Embodiments 1 to 6.

By using the present invention, even if an electric furnace having high electric power consumption is not used, a plurality of TFT substrates can be efficiently manufactured from a large glass substrate. An excellent crystalline semiconductor film having a large crystal grain diameter can be obtained by the heating treatment with the PPTA apparatus after a catalytic element is added. Further, the catalytic element remaining in the obtained crystalline semiconductor film can be gettered by the PPTA apparatus.

Besides, since the excellent crystalline semiconductor film fabricated by using the PPTA apparatus as described above can be used for an active layer of a TFT, the TFT having high reliability, and a semiconductor device using the TFT can be obtained.

What is claimed is:

1. A method of manufacturing a semiconductor device comprising:
    forming a semiconductor film;
    doping the semiconductor film with an impurity of one conductivity type to form a semiconductor region of one conductivity type; and
    activating the semiconductor region of the one conductivity type by irradiating the semiconductor region several times from a pulsed light by controlling a light source,
    wherein the light source is controlled by a temperature sensor during the irradiating, and
    wherein at least one selected from the group consisting of a halogen lamp, a metal halide lamp, a xenon arc lamp and a reduced pressure mercury lamp is used as the light source.

2. A method according to claim 1, wherein the irradiation of the pulsed light is performed in a reduced pressure atmosphere in a treatment chamber.

3. A method according to claim 1, wherein the irradiation of the pulsed light is performed in an atmosphere comprising oxygen at a concentration of in a range of 5 ppm or less in a treatment chamber.

4. A method according to claim 1, wherein the irradiating and cooling are performed at the same time.

5. A method according to claim 1, wherein the impurity of one conductivity type is at least one selected from the group consisting of N, P, As, Sb and Bi.

6. A method according to claim 1, wherein the impurity of one conductivity type is at least one selected from the group consisting of B, Al, Ga, In and Tl.

7. A method of manufacturing a semiconductor device comprising:
    forming a semiconductor film;
    doping the semiconductor film with an impurity of one conductivity type to form a semiconductor region of one conductivity type; and
    activating the semiconductor region of the one conductivity type by irradiating the semiconductor region several times from a pulsed light by controlling a light source,
    wherein the light source is controlled by temperature sensors during the irradiating, and
    wherein at least one selected from the group consisting of a halogen lamp, a metal halide lamp, a xenon arc lamp and a reduced pressure mercury lamp is used as the light source.

8. A method according to claim 7, wherein the irradiation of the pulsed light is performed in a reduced pressure atmosphere in a treatment chamber, 9. A method according to claim 7, wherein the irradiation of the pulsed light is performed in an atmosphere comprising oxygen at a concentration of in a range of 5 ppm or less in a treatment chamber.

10. A method according to claim 7, wherein the irradiating and cooling are performed at the same time.

11. A method according to claim 7, wherein at least one of the temperature sensors is provided between the substrate and the light source.

12. A method according to claim , wherein the impurity of one conductivity type is at least one selected from the group consisting of N, P, As, Sb and Bi.

13. A method according to claim 7, wherein the impurity of one conductivity type is at least one selected from the group consisting of B, Al, Ga, In and Tl.

14. A method of manufacturing a semiconductor device comprising:
    forming a semiconductor film over a substrate;
    doping the semiconductor film with an impurity of one conductivity type to form a semiconductor region of one conductivity type; and
    activating the semiconductor region of the one conductivity type by irradiating the semiconductor region several times from a pulsed light by controlling a light source,
    wherein the light source is controlled on the basis of measurement from a rear surface of the substrate by a radiation thermometer, and wherein at least one selected from the group consisting of a halogen lamp, a metal halide lamp, a xenon arc lamp and a reduced pressure mercury lamp is used as the light source.

15. A method according to claim 14, wherein the irradiation of the pulsed light is performed in a reduced pressure atmosphere in a treatment chamber.

16. A method according to claim 14, wherein the irradiation of the pulsed light is performed in an atmosphere comprising oxygen at a concentration of in a range of 5 ppm or less in a treatment chamber.

17. A method according to claim 14, wherein the irradiating and cooling are performed at the same time.

18. A method according to claim 14, wherein the impurity of one conductivity type is at least one selected from the group consisting of N, P, As, Sb and Bi.

19. A method according to claim 14, wherein the impurity of one conductivity type is at least one selected from the group consisting of B, Al, Ga, In and Tl.

* * * * *